United States Patent
Wu et al.

(10) Patent No.: US 6,901,575 B2
(45) Date of Patent: May 31, 2005

(54) RESOLVING PHASE-SHIFT CONFLICTS IN LAYOUTS USING WEIGHTED LINKS BETWEEN PHASE SHIFTERS

(75) Inventors: Shao-Po Wu, Portola Valley, CA (US); Seonghun Cho, Santa Clara, CA (US); Yao-Ting Wang, Sunnyvale, CA (US)

(73) Assignee: Numerical Technologies, Inc., Mountain View, CA (US)

( * ) Notice: Subject to any disclaimer, the term of this patent is extended or adjusted under 35 U.S.C. 154(b) by 368 days.

(21) Appl. No.: 10/012,069

(22) Filed: Dec. 5, 2001

(65) Prior Publication Data
US 2002/0083410 A1 Jun. 27, 2002

Related U.S. Application Data

(63) Continuation-in-part of application No. 09/823,380, filed on Mar. 29, 2001, now Pat. No. 6,584,610.
(60) Provisional application No. 60/243,524, filed on Oct. 25, 2000.

(51) Int. Cl.[7] .............................. G06F 17/50; G03F 9/00
(52) U.S. Cl. ................................ 716/19; 430/5; 716/2
(58) Field of Search ................................ 716/19; 430/5

(56) References Cited

U.S. PATENT DOCUMENTS

| | | | |
|---|---|---|---|
| 5,302,477 A | 4/1994 | Dao et al. | 430/5 |
| 5,308,741 A | 5/1994 | Kemp | 430/312 |
| 5,324,600 A | 6/1994 | Jinbo et al. | 430/5 |
| 5,364,716 A | 11/1994 | Nakagawa et al. | 430/5 |
| 5,472,814 A | 12/1995 | Lin | 430/5 |
| 5,523,186 A | 6/1996 | Lin et al. | 430/5 |
| 5,527,645 A | 6/1996 | Pati et al. | 430/5 |
| 5,537,648 A | 7/1996 | Liebmann et al. | 395/500 |
| 5,538,815 A | 7/1996 | Oi et al. | 430/5 |
| 5,565,286 A | 10/1996 | Lin | 430/5 |

(Continued)

FOREIGN PATENT DOCUMENTS

| | | |
|---|---|---|
| DE | 195 45 163 A1 | 6/1996 |
| EP | 0 653 679 A2 | 5/1995 |
| GB | 2333613 A | 7/1999 |
| JP | 62067547 | 3/1987 |
| JP | 2-140743 | 5/1990 |

(Continued)

OTHER PUBLICATIONS

P. Berman et al., Optimal Phase Conflict Removal for Layout of Dark Field Alternating Phase Shifting Masks, IEEE Transaction on Computer–Aided Design of Integrated Circuits and Systems, pp. 175–187, vol. 19, No. 2, Feb. 2000.*
A. B. Kahng, IC Layout and Manufacturability: Critical Links and Design Flow Implications, Proceedings of Twelfth Internationa Conference on VLSI Design, pp. 100–105, Jan. 1999.*

(Continued)

*Primary Examiner*—A. M. Thompson
(74) *Attorney, Agent, or Firm*—Bever, Hoffman & Harms, LLP; Jeanette S. Harms

(57) ABSTRACT

A method of assigning phases to shifters on a layout is provided. The method includes creating a link between any two shifters within a predetermined distance from each other. In one embodiment, the predetermined distance is larger than a minimum feature size on the layout, and smaller than a combined minimum pitch and regulator width. A weight can be assigned to each created link. Phases can be assigned to the shifters, wherein if a phase-shift conflict exists on the layout, then one or more links can be broken based on their weight.

29 Claims, 20 Drawing Sheets

U.S. PATENT DOCUMENTS

| | | | |
|---|---|---|---|
| 5,573,890 A | 11/1996 | Spence | 430/311 |
| 5,595,843 A | 1/1997 | Dao | 430/5 |
| 5,620,816 A | 4/1997 | Dao | 430/5 |
| 5,635,316 A | 6/1997 | Dao | 430/5 |
| 5,636,131 A | 6/1997 | Liebmann et al. | 364/490 |
| 5,702,848 A | 12/1997 | Spence | 430/5 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,807,649 A | 9/1998 | Liebmann et al. | 430/5 |
| 5,858,580 A | 1/1999 | Wang et al. | 430/5 |
| 5,923,562 A | 7/1999 | Liebmann et al. | 364/488 |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,004,701 A * | 12/1999 | Uno et al. | 430/5 |
| 6,057,063 A | 5/2000 | Liebmann et al. | 430/5 |
| 6,066,180 A | 5/2000 | Kim et al. | 716/19 |
| 6,083,275 A | 7/2000 | Heng et al. | |
| 6,130,012 A | 10/2000 | May et al. | 430/5 |
| 6,139,994 A | 10/2000 | Broeke et al. | 430/5 |
| 6,185,727 B1 | 2/2001 | Liebmann | 716/19 |
| 6,228,539 B1 | 5/2001 | Wang et al. | 430/5 |
| 6,251,549 B1 | 6/2001 | Levenson | 430/11 |
| 6,258,493 B1 | 7/2001 | Wang et al. | 430/5 |
| 6,335,128 B1 | 1/2002 | Cobb et al. | 430/5 |
| 6,338,922 B1 | 1/2002 | Liebmann et al. | 430/5 |
| 6,420,074 B2 | 7/2002 | Wang et al. | 430/5 |
| 6,436,590 B2 | 8/2002 | Wang et al. | 430/5 |
| 6,485,871 B1 | 11/2002 | Kruger et al. | |
| 6,493,866 B1 | 12/2002 | Mayhew | |
| 6,584,610 B1 * | 6/2003 | Wu et al. | 716/19 |
| 2001/0000240 A1 | 4/2001 | Wang et al. | 430/5 |
| 2001/0028985 A1 | 10/2001 | Wang et al. | 430/5 |
| 2002/0081500 A1 | 6/2002 | Cobb et al. | |
| 2002/0083410 A1 | 6/2002 | Wu et al. | 716/19 |
| 2002/0100005 A1 | 7/2002 | Anderson et al. | |
| 2002/0127479 A1 | 9/2002 | Pierrat | 430/5 |
| 2002/0129327 A1 | 9/2002 | Pierrat et al. | 716/19 |
| 2002/0152454 A1 | 10/2002 | Cote et al. | 716/21 |
| 2002/0155353 A1 | 10/2002 | Cote et al. | 430/5 |
| 2002/0160278 A1 | 10/2002 | Winder et al. | |
| 2002/0192575 A1 | 12/2002 | Stanton | |

FOREIGN PATENT DOCUMENTS

| | | |
|---|---|---|
| JP | 1283925 | 2/1991 |
| JP | 6-67403 | 3/1994 |
| JP | 8051068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 98/12602 A1 | 3/1998 |
| WO | WO 01/23961 A1 | 4/2001 |
| WO | WO 02/03140 A1 | 1/2002 |

OTHER PUBLICATIONS

A. S. Wong et al., Investigating Phase–Shifting Mask Layout Issues Using A CAD Toolkit, International Electron Devices Meeting, pp. 705–708, Dec. 1991.*

A.B. Kahng et al., Subwavelength Lithography and its Potential Impact on Design and EDA, Proceedings of the 36th ACM/IEEE conference on Design Automation Conference, pp. 799–804, Jun. 1999.*

A.B. Kahng et al., New Graph Bipartizatioris for Double–Exposure, Bright Field Alternating Phase–Shift Mask Layout, Proceedings of the ASP–DAC, pp. 133–138, Jan. 2001.

Cooke, M., "OPC/PSM Designs For Poly Gate Layers", European Semiconductor. vol. 22. No. 7. pp. 57–59, Jul. 2000.

Granik, Y., et al., "Sub–Resolution Process Windows And Yield Estimation Technique Based On Detailed Full–Chip CD Simulation", SPIE, vol. 4182, pp.335–341 (2000).

Plat, M., et al., "The Impact of Optical Enhancement Techniques on the Mask Error Enhancement Funchtion (MEEF)", SPIE, vol. 4000, pp. 206–214. Mar. 1–3. 2000.

Mansuripur, M., et al., "Projection Photolithography", Optics & Photonics News 11, 17 pages, Feb. 2000.

Ackmann, P., et al., "Phase Shifting and Optical Proximity Corrections to Improve CD Control on Logic Devices in Manufacturing for Sub 0.35 um I–Line", Advance Micro Devices (8 pages).

Matsuoka, K., et al., "Application of Alternating Phase–Shifting Mask to 0.16um CMOS Logic Gate Patterns", Matsushita Electric Ind. Co., Ltd. (9 pages).

Wang, R., et al., "Plarized Phase Shift Mask: Concept, Design, and Potential Advantages to Photolithography Process and Physical Design", Motorola Semiconductor Product Sector (12 pages).

Ogawa, K., et al., "Phase Defect Inspection by Differential Interference", Lasertec Corporation (12 pages).

Pistor, T., "Rigorous 3D Simulation of Phase Defects in Alternating Phase–Shifting Masks", Panoramic Technology Inc. (13 pages).

Semmier, A., et al., "Application of 3D EMF Simulation for Development and Optimization of Alternating Phase Shifting Masks", Infineon Technologies AG (12 pages).

Wong, A., et al., "Polarization Effects in Mask Transmission", University of California Berkeley (8 pages).

Erdmann, A., "Topography Effects and Wave Aberrations in Advanced PSM–Technology", Fraunhofer Institute of Integrated Circuits (11 pages).

Granik, Y., et al., "CD Variation Analysis Technique and its Application to the Study of PSM Mask Misalignrnent", Mentor Graphics (9 pages).

Hanyu, et al., "New Phase–Shifting Mask with Highly Transparent SiO2 Phase Shifters", Fujitsu Laboratories Ltd (11 pages).

Ishiwata, N., et al., "Fabrication of Phase–Shifting Mask", Fujitsu Limited (11 pages).

Levenson, M., et al., "Phase Phirst! An Improved Strong–PSM Paradigm", M.D. Levenson Consulting, Petersen Advanced Lithography, KLA–Tencor (10 pages).

Levenson, M., et al., "SCAA Mask Exposures and Phase Phirst Design for 110nm and Below", M.D. Levenson Consulting, Canon USA, Inc., JSR Microelectronics, Inc. (10 pages).

Lin, B.J., "The Relative lmportance of the Building Blocks for 193nm Optical Lithography", Linnovation, Inc. (12 pages).

McCallum, M., et al., "Alternating PSM Mask Performance—a Study of Multiple Fabrication Technique Results", International SEMATECH (6 pages).

Morikawa, Y., et al., "100nm–alt.PSM Structure Discussion for ArF Lithography", Dai–Nippon Printing Co., Ltd. (15 pages).

Ozaki, T., et al., "A 0.15um KrF Lithography for 1Gb DRAM Product Using Highly Printable Patterns and Thin Resist Process", Toshiba Corporation (2 pages).

Rhyins, P., et al., "Characterization of Quartz Etched PSM Masks for KrF Lithography at the 100nm Node", Photronics. Inc., MIT Lincoln Lab; ARCH Chemicals, Finle Technologies, KLATencor Corp. (10 pages).

Rosenbluth, A., et al., "Optimum Mask and Source Patterns to Print a Given Shape", IBM (17 pages).

Schmidt. R., et al., "Impact of Coma on CD Control for Multiphase PSM Designs", AMD, ASML (10 pages).

Sewell, H., et al., "An Evaluation of the Dual Exposure Technique", SVG Lithography Systems Inc. (11 pages).

Spence, C., et al., "Optimization of Phase–Shift Mask Designs Including Defocus Effects", AMD, Princeton University, Vecor Technologies Inc. (8 pages).

Suzuki. A., et al., "Multilevel Imaging System Realizing k1=–.3 Lithogrpahy", Canon Inc. (13 pages).

Vandenberghe, G., et al., "(Sub–)100nm Gate Patterning Using 248nm Alternating PSM", IMEC, Mentor Graphics (9 pages).

Fritze, M., et al., "100–nm Node Lithography with KrF?", MIT Lincoln Lab, Numberical Technologies. Photronics, Arch Chemicals (14 pages).

Fukuda, H., et al., "Patterning of Random Interconnect Using Double Exposure of Strong–Type PSMs", Hitachi Central Research Lab (8 pages).

Ferguson, R., et al., "Pattern–Dependent Correction of Mask Topography Effects for Alternating Phase–Shifting Masks", IBM Microelectronics, University of California Berkeley (12 pages).

Toublan, O., et al., "Phase and Transmission Errors Aware OPC Solution for PSM: Feasibility Demonstration", Mentor Graphics Corp. (7 pages).

Yanagishita, Y.. et al., "Phase–Shifting Photolithography Applicable to Real IC Patterns", Fujitsu Limited (11 pages).

Levenson, M., et al., "Improving Resolution in Photolithography with a Phase–Shifting Mask", IEEE, Transactions On Electron Devices, vol. ED–29, No. 12, pp. 1828–1836, Dec. 1982.

Levenson. M., et al., "The Phase–Shifting Mask II: Imaging Simulations and Submicrometer Resist Exposures", IEEE Transactions on Electron Devices, vol. ED–31, No. 6, pp. 753–763. Jun. 1984.

Terasawa. T., et al., "0.3–Micron Optical Lithography Using a Phase–Shifting Mask", SPIE, Optical/Laser Microlithography II, vol. 1088, pp. 25–33, Mar. 1989.

Nitayama, A., et al., "New Phase Shifting Mask with Self–Aligned Phase Sifters for a Quarter Micron Photolithography", IEDM, pp. 3.3.1–3.3.4, Dec. 3–6, 1989.

Jinbo, H., et al., "0.2um or Less i–Line Lithography by Phase–Shifting–Mask Technology", IEEE, pp. 33.3.1–33.3.4 (1990).

Neureuther, A., "Modeling Phase Shifting Masks", SPIE. 10th Annual Symposium On Microlithography, vol. 1496, pp. 80–85 (1990).

Yamanaka, T., et al., "A 5.9um2 Super Low Power SRAM Cell Using a New Phase–Shift Lithography", IEDM, pp. 18.3.1–18.3.4 (1990).

Inokuchi, K., et al., "Sub–Quarter Micron Gate Fabrication Process Using Phase–Shifting–Mask for Microwave GaAs Devices", Extended Abstracts Of The 1991 Intl. Conference On Solid State Devices And Materials, Yokohama, Japan, pp. 92–94 (1991).

Inokuchi, K., et al., "Sub–Quarter–Micron Gate Fabrication Process Using Phase–Shifting Mask for Microwave GaAs Devices", Japanese Journal Of Applied Physics, vol. 30, No. 12B, pp. 3818–3821. Dec. 1991.

Jinbo, H., et al., "Improvement of Phase–Shifter Edge Line Mask Method", Japanese Journal Of Applied Physics, vol. 30, No. 11B, pp. 2998–3003, Nov. 1991.

Kimura, T., et al., "Subhalf–Micron Gate GaAs Mesfet Process Using Phase–Shifting–Mask Technology", IEEE, GaAs IC Symposium, pp. 281–284 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346–355 (1991).

Hirai, Y., et al., "Automatic Pattern Generation System for Phase Shfiting Mask", 1991 Symposium on VLSI Technology, Digest of Technical Papers, pp. 95–96, May 28–30, 1991.

Wong, A., et al., "Investigating Phase–Shifting Mask Layout Issues Using a Cad Toolkit", IEEE, pp. 27.4.1–27.4.4 (1991).

Terasawa, T., et al., "Imaging Characteristics of Multi–Phase–Shifting and Halftone Phase–Shifting Masks", Japanese Journal of Applied Physics, vol. 30, No. 11B, pp. 2991–2997, Nov. 1991.

Burggraaf, P., "Four More Significant Japanese Advances in Phase Shfiting Technology", Semiconductor International, p. 16, Dec. 1991.

Kemp. K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Inoue, S., et al., "Simulation Study on Phase–Shifting Masks for Isolated Patterns", Japanese Journal of Applied Physics, vol. 30, No. 11B, pp. 3010–3015, Nov. 1991.

Watanabe, H., et al., "Detection and Printability of Shifter Defects in Phase–Shifting Masks". Japanese Journal of Applied Physics, vol. 30, No. 11B, pp. 3016–3020, Nov. 1991.

Watanabe, H., et al., "Pattern Transfer Characteristics of Transparent Phase Shifting Mask". Japanese Journal of Applied Physics, vol. 30, No. 11B, pp. 3004–3009, Nov. 1991.

Jinbo, H., et al., "Application of Blind Method to Phase–Shifting Lithography", IEEE, 1992 Symposium On VLSI Technology Digest Of Technical Papers, pp. 112–113 (1992).

Watanabe, H., et al., "Detection and Printability of Shifter Defects in Phase–Shifting Masks II Defocus Characteristics", Jpn. J. AppI. Phys., vol. 31, pp. 4155–4160 (1992).

Pierrat, C., et al., "Phase–Shifting Mask Topography Effects on Lithographic Image Quality", IEEE, pp. 3.3.1–3.3.4 (1992).

Burggraaf, P., "Lithography's Leading Edge, Part 1: Phase–Shift Technology and Part 2:I–Line and Beyond", Semiconductor International, pp. 43–47 and 52–56, Feb. 1992.

IBM, "Phase–Shift Mask Utilizing Silicon Oxy–Nitride as a Low Reflectivity Phase–Shift Layer", IBM Technical Disclosure Bulletin. vol. 34, No. 10B, pp. 360–361, Mar. 1992.

Brunner, T., et al., "170nm Gates Fabricated by Phase–Shift Mask and Top Anti–Reflector Process", SPIE, Optical/Laser Microlithography VI. Vo. 1927, pp. 182–189 (1993).

Lin, B.J., "Phase–Shifting Masks Gain an Edge", IEEE Circuits & Devices, pp. 28–35, Mar. 1993.

Moniwa, A., et al., "Algorithm for Phase–Shift Mask Design with Priority on Shifter Placement", Jpn. J. Appl. Phys., vol. 32, Pt. 1, No. 12B, pp. 5874–5879, Dec. 1193.

Ooi, K., et al., "Computer Aided Design Software for Designing Phase–Shifting Masks", Jpn. J. Appl. Phys., vol. 32, Pt 1, No. 12B, pp. 5887–5891, Dec. 1993.

Ohtsuka, H., et al., "Evaluation of Repair Phase and Size Tolerance for a Phase–Shift Mask", J. Vac. Sci. Technol. B, vol. 11, No. 6, pp. 2665–2668 Nov./Dec. 1993.

Ronse, K., et al., "Comparison of Various Phase Shift Strategies and Application to 0.35um ASIC Designs", SPIE—Optical/Laser Microlithography VI, vol. 3927, pp. 2–16 (1993).

Galan, C., et al., "Application of Alternating–Type Phase Shift Mask to Polysilicon Level for Random Logic Circuts", Jpn. J. Appl. Phys., vol. 33, pp. 6779–6784 (1994).

Mizuno, F., et al., "Practical Phase–Shifting Mask Technology for 0.3um Large Scale Integrations", J. Vac. Sci. Technol. B, vol. 12, No. 6, pp. 3799–3803, Nov./Dec. 1994.

Pati, Y.C., et al., "Phase–Shifting Masks for Microlithography: Automated Design and Mask Requirements", J. Opt. Soc. Am., vol. 11, No. 9, pp. 2438–2452, Sep. 1994.

Stirniman, J., et al., "Wafer Proximity Correction and Its Impact on Mask–Making", Bacus News, vol. 10, Issue 1, pp. 1, 3–7, 10–12, Jan. 1994.

Waas, T., et al., "Automatic Generation of Phase Shift Mask Layouts", Microelectronic Engineering, vol. 23, pp. 139–142 (1994).

Barouch, E., et al., "OPTIMASK: An OPC Algorithm for Chrome and Phase–Shift Mask Design", SPIE, Vo. 2440, pp. 192–206, Feb. 1995.

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Langston, J., et al., "Extending Optical Lithography to 0.25um and Below", Solid State Technology, pp. 57–64, Mar. 1995.

Nagahiro, Y., "Improved Mask Technique for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1995.

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Ishiwata, N., et al., "Novel Alternating Phase Shift Mask with Improved Phase Accuracy", SPIE, Proceedings Of The 17th Annual Symposium On Photomask Technology And Management, vol. 3236, pp. 243–249 (1997).

Morimoto, H., et al., "Next Generation Mask Strategy— Technologies are Ready for Mass Production of 256MDRAM?", SPIE, vol. 3236, pp. 188–189 (1997).

Roman, B., et al., "Implications of Device Processing on Photomask CD Requirements", SPIE, Vol. 3236 (1997) (Abstract Only).

Nakae, A., et al., "A Proprosal for Pattern Layout Rule in Application of Alternating Phase Shift Mask", SPIE, vol. 3096, pp. 362–374 (1997).

Tsujimoto, E., et al., "Hierarchical Mask Data Design System (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36. Part 1, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co., Ltd. (16 pages).

Ohnuma, H., et al., "Lithography Computer Aided Design Technology for Embedded Memory in Logic", Jpn. J. Appl. Phys., vol. 37, Part I, No. 12B, pp. 6686–6688, Dec. 1998.

Fukuda, H., "Node–Connection/Quantum Phase–Shifting Mask: Path to Below 0.3um Pitch, Proximity Effect Free, Random Interconnects and Memory Patterning", J. Vac. Sci. Technol. B, vol. 17, No. 6, pp. 3291–3295, Nov./Dec. 1999.

Spence, C., et al., "Integration of Optical Proximity Correction Strategies in Strong Phase Shifters Design for Poly–Gate Layers", Bacus News, Vol. 15, Issue 12, pp. 1, 4–13, Dec. 1999.

Kuo, C., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Perfomance 0.10um CMOS Process", The 44th International Conference on Electron, Ion and Photon Beam Technology and Nanofabrication Abstracts, pp. 18–19, May 30–Jun. 2, 2000.

Pierrat, C., "Investigation of Proximity Effects in Alternating Aperture Phase Shifting Masks", Numerical Technologies. lnc (11 pages).

Kikuchi, K., et al., "Method of Expanding Process Window for the Double Exposure Technique with alt–PSMs", Optical Microlithography XIII, Proceeding of SPlE, vol. 4000, pp. 121–131 (2000).

* cited by examiner

RESOLVING PHASE-SHIFT CONFLICTS IN LAYOUTS USING WEIGHTED LINKS BETWEEN PHASE SHIFTERS

CLAIM OF PRIORITY

This application is a continuation in part of U.S. application Ser. No. 09/823,380, filed Mar. 29, 2001, now U.S. Pat. No. 6,584,610, issued Jun. 24, 2003, entitled "Incrementally Resolved Phase-Shift Conflicts In Layouts For Phase-Shifted Features" by Shao-Po Wu and Yao-Ting Wang, which is incorporated by reference herein, and is related to U.S. provisional application No. 60/243,524 filed Oct. 25, 2000.

BACKGROUND OF THE INVENTION

1. Field of the Invention

This invention relates to the field of printed circuit manufacturing. In particular, this invention relates to assigning phases to shifters on masks used to fabricate integrated circuits.

2. Description of Related Art

Conventional integrated circuit (IC) fabrication involves many steps in common with other processes that impose physical structures in a layer on a substrate, such as laying ink in patterns on a page, or laying chrome in patterns on a quartz substrate. Some of the important steps viewed at a high level are depicted in FIG. 1.

In step 110, engineers use a functional computer aided design (CAD) process, to create a schematic design, such as a schematic circuit design consisting of individual devices coupled together to perform a certain function or set of functions. The schematic design 115 is translated into a representation of the actual physical arrangement of materials upon completion, called a design layout 125, with a physical design process 120. If multiple layers are involved, as is typical for an IC, a design layout is produced for each layer, e.g., design layouts 125a, 125b, etc. FIG. 2 shows a sample design layout. A fabrication layout design process 130 produces one or more fabrication layouts 135, such as masks for each design layout 125a. The one or more fabrication layouts 135 are then used by a substantiation process 140 to actually produce physical features in a layer, called here the printed features layer 149.

One recent advance in optical lithography called phase shifting generates features in the printed features layer 149 that are smaller than the features on the mask 135a projected onto the printed features layer 149. Such fine features are generated by the destructive interference of light in adjacent separated windows in the mask called phase shifters (hereinafter shifters). FIG. 3 shows two adjacent shifters, 310 and 312, in a mask 300. The shifters 310 and 312 are light transmissive areas on the mask separated by an opaque area 311 with a width 313 when projected onto the printed features layer 149. The projection of Wm onto the printed features layer 149 is limited by the resolution of the optical process. However, if the light of a single wavelength passing through one of the shifters, e.g. 310, is out of phase (by 180 degrees or n radians) with the light of the same wavelength passing through the other shifter, e.g. 312, then an interference pattern is set up on the printed features layer 149 during the substantiation process 140. This interference generates a printed feature 350 having a width 353 that is less than the width 313 of the opaque area projected onto the printed features layer 149. In other embodiments, the width 313 and width 353 are much closer and can be equal. In each case, the width 353 of the printed feature is less than can be produced by the same optical system without phase shifting.

The use of phase shifting puts extra constraints on the fabrication layouts 135, and hence on the design layout, e.g. 125a. These constraints are due to several factors. One factor already illustrated is the need for finding space on the mask, e.g., 135a, for the two shifters, 310 and 312, as well as for the opaque area 311 between them. This precludes the one mask from placing additional features on the printed features layer 149 in the region covered by the projection of the two shifters 310 and 312 and the opaque area 311. Another factor is that overlapping or adjacent shifters on a single mask, used, for example, to generate neighboring phase-shifted features, generally do not have different phases. Adjacent shifters with different phases will produce a spurious feature.

Currently, design layouts 125 may provide the space needed for placement of phase shifters through design rules, but shifters are actually placed and simultaneously assigned a phase in the conventional fabrication design steps, not shown, in attempts to produce the fabrication layouts. As complex circuits are designed, such as by combining many standard cells of previously designed sub-circuits, shifters may overlap or become adjacent in the layouts. Depending on the placement and relative phases of these shifters, phase-shift conflicts can then result. It is generally recognized that resolving phase-shift conflicts should be done globally, after the whole circuit is laid out, because swapping the phases of a pair of shifters to resolve one conflict can generate a new conflict with another neighboring feature already located in the design or one added later. The conventional IC design systems try to reassign phases of individual pairs to resolve the conflicts at the end of the design process when all the phase conflicts are apparent. For example, iN-Phase™ software from Numerical Technologies, Inc. of San Jose, Calif., uses this conventional technique.

For example, FIG. 4A shows a T-junction element 440 that is desirably formed with narrow phase-shifted features 443, 442 and 444 as well as with wide non-critical features 441 and 445. FIG. 4A shows a pair of shifters 410 and 420 needed to form the vertical phase-shifted feature 443 of element 440. FIG. 4A also shows another shifter 415 disposed opposite shifter 410 to form the left half 442 of the horizontal phase-shifted feature of element 440. Similarly, FIG. 4A also shows a fourth shifter 425 disposed opposite shifter 420 to form the right half 444 of the horizontal phase-shifted feature of element 440. Shifters 415 and 425 are so close that they violate a design rule requiring at least a minimum spacing X between adjacent shifters. That is, separation 427 is less than X.

In the conventional fabrication CAD process, not shown, the shifters 410, 420, 415 and 425 are placed as shown and assigned phases, but the phase-shift conflict is not addressed until all the elements of the design layout have been accounted for. Then the design rule is applied in which shifters 415 and 425 are replaced by a single shifter 430, as shown in FIG. 4B.

However, there is no assignment of phase for shifter 430 that can simultaneously be opposite to the phases assigned to shifters 410 and 420, because shifters 410 and 420 are already opposite to each other. Thus such a design has a conflict that cannot be solved by changing the phases assigned to the shifters. Some re-arrangement of shifters or features or both is needed. In this example, however, the feature 440 from the physical design layout does not allow shifter 430 to be moved and does not allow another shifter to be inserted. Thus the fabrication layout design process 130 cannot move or change the shifters enough to resolve the conflict.

When a phase-shift conflict is irresolvable by the fabrication layout design process 130, then the physical design process 120 is run again to move or reshape the features, such as those of element 440. Process flow with an irreconcilable phase-shift conflict is represented in FIG. 1, which shows that fabrication layouts 135 are produced along the arrow marked "Succeed" if the fabrication layout design process 130 succeeds, but that control returns to the physical design process 120 along the arrow marked "Fail" if the fabrication layout design process 130 fails, such as if it fails to resolve all phase conflicts.

While suitable for many purposes, the conventional techniques have some deficiencies. As designs, such as designs for IC circuits, become more complex, the time and effort involved in performing the physical design process 120 and the fabrication layout design process 130 increase dramatically, consuming hours and days. By resolving phase-shift conflicts at the end of this process, circumstances that lead to irresolvable phase-shift conflicts are not discovered until the end of these time consuming processes. The discovery of such irresolvable phase-shift conflicts induces the design engineers to start over at the physical design process 120. The processes 120 and 130 are repeated until final design layouts and fabrication layouts without phase-shift conflicts are produced. This procedure multiplies the number of days it takes a foundry to begin producing IC chips. In a commercial marketplace where IC advancements occur daily, such delays can cause significant loss of market share and revenue.

Techniques are needed to discover and resolve phase-shift conflicts earlier in the sequence of physical layout designing and fabrication layout designing. Repeatedly assigning phases to the same shifters is undesirable in such techniques, however, because such repetition indicates inefficient processing and wasted processing resources.

SUMMARY OF THE INVENTION

A method of assigning phases to shifters on a layout is provided. The method includes creating a link, or relationship, between any two shifters that are within a predetermined distance from each other. The link corresponds to an indication that linked shifters are preferably assigned different phase. The two shifters can include those shifters that define a critical feature. In one embodiment, the predetermined distance is larger than a minimum feature size on the layout, and smaller than a combined minimum pitch and regulator width.

In one embodiment, the problem of assigning phases can be represented as a graph coloring problem. Accordingly, in such embodiments, the links correspond to additional edges added to the graph representation. Note that depending how the graph is constructed, the links may correspond to vertices and/or may result in the removal/modification of existing edges/vertices in the graph. For convenience, the description will assume that the shifters are represented as vertices and the links as edges indicating that the shifters connected by the link are preferably assigned different phases/colors.

In the graph representation described, a phase-shift conflict corresponds to an odd-length cycle in the graph. Consider the simple case of three shifters (vertices) connected in a circle by links (edges). That means that the first shifter needs to be phase X, the second shifter is phase X+180, and the third shifter is phase X. However, the link (edge) between the third shifter and the first shifter requires that the third and first shifters have different phases. Thus, to avoid phase-shift conflict in the prior art, the first shifter should have both phases X and X+180, which is an impossible condition.

In accordance with one feature of the invention, a weight can be assigned to each created link. Phases can be assigned to the shifters. If a phase-shift conflict exists on the layout, then one or more links can be broken based on their weight. Returning to the above example, if the weights of the links between the first and second shifters and the second and third shifters were higher than the weight of the link between the third shifter and the first shifter, then the link between the third and first shifter could be ignored while performing the coloring operation.

In one embodiment, if the link crosses a critical feature, then the link is given the highest weight relative to the other links. Such a link is considered a "hard" or normally an unbreakable link. In contrast, if the link crosses a non-critical feature or no feature, then the link is given a weight commensurate with the severity of the effect of a phase-shift conflict on the area including the two shifters. Such a link is considered a "soft" or breakable link. In one implementation, a hard link is assigned a weight of "1.0" and a soft link is assigned a weight less than "1.0" but greater than or equal to "0.0".

Note that in one embodiment, the hard link can be broken. However, in this embodiment, the user can be notified that a phase-shift error affecting a critical feature has been encountered. The phase assignment program can identify that critical feature and stop processing that region of the layout, but continue phase shifting the remainder of the layout to the extent practical.

Returning to the above example, the first and second shifters may be defining a critical feature and the intervening link may have a weight of 1.0. The second and third shifters may be relatively nearer to one another than the third and first shifters and so the link from the second to the third shifter may have a weight of 0.5 whereas the link from the third to the first shifter may have a weight of only 0.2.

The weight assigned to the link can be determined using various factors. For example, assigning a weight can include determining the distance between the two shifters, wherein the greater the distance, the lower the weight.

In another embodiment, assigning a weight can include determining at least one dimension associated with each of the two shifters, wherein the larger the dimension(s), the higher the weight.

In another embodiment, assigning a weight can include determining an orientation of the two shifters. For example, the orientation can refer to a length over which the two shifters are in alignment with one another in the longer direction, wherein the greater the length, the higher the weight.

In another embodiment, assigning a weight can include determining whether a feature is located between the two shifters, wherein a link crossing a feature has a higher weight than a link crossing no feature.

In another embodiment, assigning a weight can include determining a minimum distance from the feature to any proximate shifter, wherein the greater the minimum distance, the lower the weight.

In another embodiment, assigning a weight can include identifying the feature by its type. For example, the type can refer to a feature that can be used in the standard operation of the implemented circuit or a feature that can be used in a test operation of the implemented circuit. In one embodiment, the type can refer to features for forming memory, logic, and/or high-speed devices. In yet another embodiment, the type can refer to specific locations on the user's design and/or branches/cells within a hierarchy. The type can be identified from one or more input data files, through a graphical user interface (GUI) on a computer, etc.

In yet another embodiment, assigning a weight can include determining a size of the feature, wherein the larger the feature, the lower the weight.

In yet another embodiment, assigning a weight can include determining an association between the feature and another feature on another layout or on a related layer of the same layout, wherein a link having an association has a higher weight than a link without an association. In one embodiment, a feature, such as a first conductive line, will have a connection to another feature, such as a contact (wherein the association is provided by a different layout than that provided for the conductive line), in a specified area. Thus, a link crossing the first conductive line in this area can have a higher weight than a second conductive line (or the first conductive line in another area) that will not have a connection to a contact.

In yet another embodiment, assigning a weight can include determining critical dimension (CD) variations of features using simulation. Specifically, after proximate shifters having a feature between them are identified, simulations can be performed to determine CD variations of that feature. The simulations can include both opposite and same phase assignments. Other features in the layout can be simulated in a similar manner. A link crossing a feature that exhibits significant CD variations during simulation is given a higher weight than another link crossing another feature that exhibits minimal CD variations during simulation. Notably, this comparison can take into account both opposite and same phase assignments. For example, simulations for two features assuming same phase assignments can be compared to determine which feature exhibits more CD variations. Additionally, simulations for two features assuming opposite phase assignments can be compared to determine which feature exhibits less CD variation. In this manner, assuming that one comparison does not provide a substantial difference, the other comparison might highlight a significant difference, thereby indicating the more appropriate weights for the two links.

Note that determining the weight of the link can include considering multiple factors. In one embodiment, the multiple factors can be prioritized and the link can be assigned a weight based on the factor with the highest priority. In another embodiment, the link can be assigned an average weight based on the weights provided by the multiple factors. In yet another embodiment, the multiple factors themselves can be weighted, thereby resulting in a weighted average value being assigned to the link.

A method of assigning phases to shifters on a layout is also provided. The method includes identifying a plurality of critical features on the layout, wherein each critical feature has a pair of associated shifters. Any non-critical feature on the layout can be identified, wherein the non-critical feature is without a pair of associated shifters, but is located between two proximate shifters (the two proximate shifters being located within a predetermined distance of each other). Phases can be assigned to the pairs of associated shifters. Advantageously, the method minimizes phase-shift conflicts between the shifters.

The method can further include creating a hard link between the pair of associated shifters, wherein a hard link indicates that the associated shifters should have opposite phase to define a feature using a phase shifting mask. A soft link can be created between the two proximate shifters, wherein a soft link indicates that the proximate shifters preferably have opposite phase. Each soft link has an associated weight. Minimizing phase-shift conflict includes breaking the soft link having the lowest/highest weight. In one embodiment, lowest valued soft links can be broken until the phase-shift conflict is resolved.

A computer program product is also provided. The computer program product includes a computer usable medium having a computer readable program code embodied therein for causing a computer to analyze a layout including a plurality of shifters and to resolve any phase-shift conflict on the layout. The computer readable program code includes computer readable program code that creates a link between any two shifters within a predetermined distance from each other, computer readable program code that assigns a weight to each link, and computer readable program code that assigns phases to the shifters. If a phase-shift conflict exists on the layout, then a link can be broken based on its weight.

A program storage device readable by a machine, tangibly embodying a program of instructions executable by said machine to perform method steps to analyze a mask used in lithography, is also provided. The method steps include creating a link between any two shifters within a predetermined distance from each other, assigning a weight to each link, and assigning phases to the shifters. If a phase conflict exists on the layout, then one or more links can be broken based on their weight. The broken links have a different range of weights than any remaining links between shifters.

A phase shifting mask used in lithography is also provided. The mask includes a plurality of shifters, wherein if any pair of the plurality of shifters are within a predetermined distance of each other, then substantially all such shifter pairs have opposite phase.

A computer system for resolving phase-shift conflicts is also provided. The system includes a memory medium, at least one processor implementing a coloring engine for assigning relative phases to a plurality of shifters on a layout, and a conflict resolution module for determining whether there is a phase-shift conflict between any two shifters within a predetermined distance from each other. The conflict resolution module can assign a weight to a link connecting the two shifters, for example in a graph-based representation of the coloring problem. This assignment can be based on whether a feature is located between the two shifters, a distance from the feature to at least one of the two shifters, the feature type, the size of the feature, and an association between the feature and another feature on another layout. In one embodiment, the conflict resolution module defines the predetermined distance as larger than a minimum feature size on the layout, but smaller than a combined minimum pitch and regulator width.

A system for producing a layout with shifters is also provided. The system includes a placement means for placing into a layout a plurality of shifters and a coloring means for assigning phase information for the plurality of shifters based on weights assigned to links connecting the plurality of shifters.

A fabrication layout for a layer of a device is also provided. The fabrication layout includes a plurality of shifters, wherein if any pair of the plurality of shifters are within a predetermined distance of each other, then substantially all such shifter pairs have opposite assigned phase.

DETAILED DESCRIPTION OF THE INVENTION

A method and apparatus for fabricating printed features layers, such as in integrated circuits, are described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Functional Overview

Figure 1:
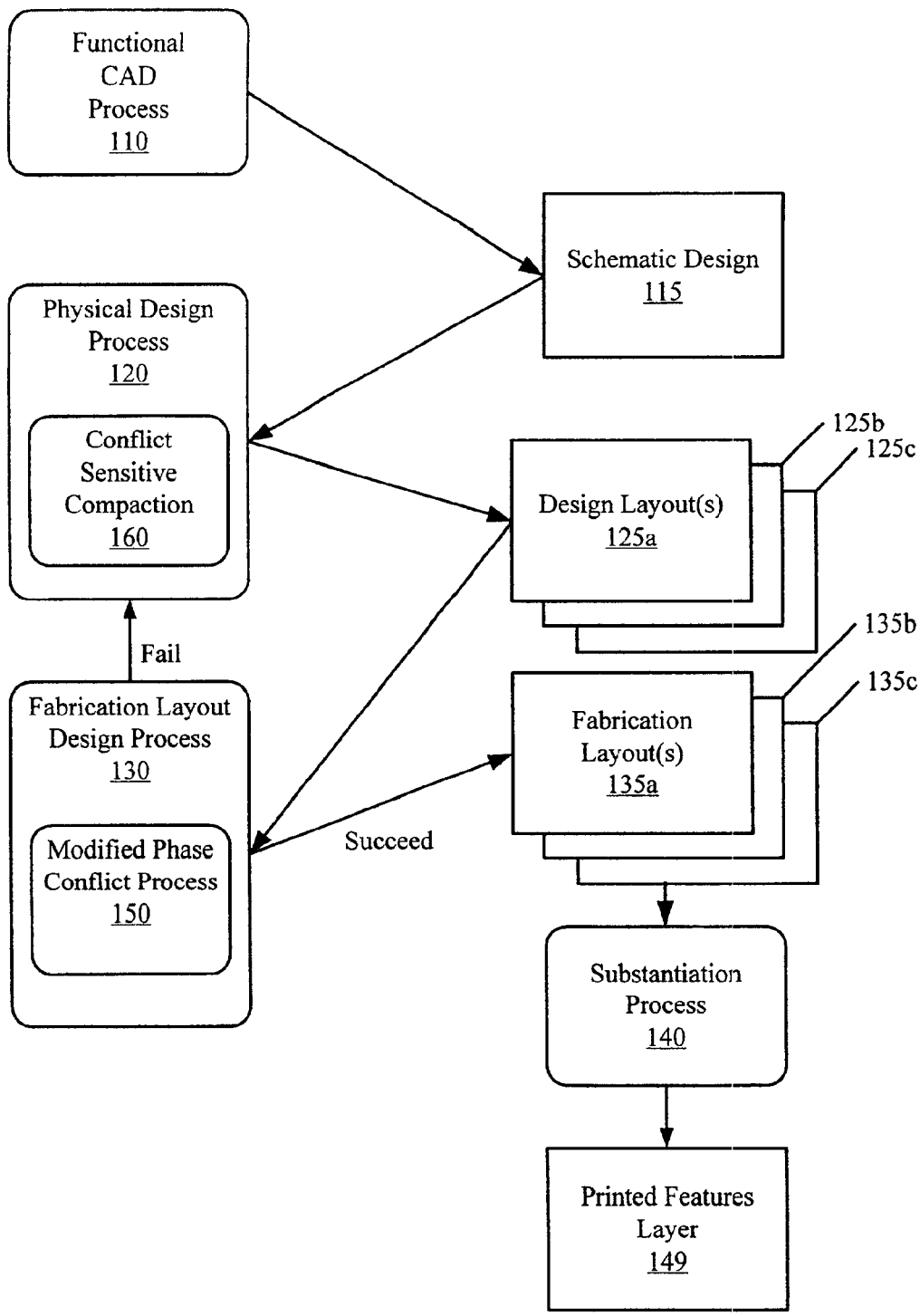
FIG. 1 is a block diagram showing the sequence of processes and layouts utilized in the formation of printed features layers according to one embodiment.

Techniques are provided for designing and fabricating printed features layers using a conflict sensitive compaction process 160 in the physical design process 120, and a modified phase conflict process 150 in the fabrication layout design process 130, as shown in FIG. 1. In the remainder of this section the relationship between the two techniques is described at a high level. In the following sections the modified phase conflict process, using incremental resolution of phase conflicts, is described in more detail. In subsequent sections, the conflict sensitive compaction techniques are described in more detail.

The conflict sensitive compaction process 160 uses information supplied by the fabrication layout design process 130 about the existence of one or more particular phase-shift conflicts in order to adjust the arrangement of elements and features in one or more design layouts 125.

The modified phase conflict process 150 separates the task of placing shifters, for example with a placement engine, from the task of assigning phases to those shifters. In particular, relative phases are assigned to shifters on a hierarchical unit basis, using a coloring engine. Coloring means assigning phase information to units, such as relative phases for pairs of shifters. With the relative phases so assigned, the modified phase conflict process 150 determines whether there is a phase-shift conflict within the unit. Absolute phases are not assigned until relative phases without phase-shift conflicts can be assigned to each unit in the hierarchy of the design layout.

If any unit has a phase-shift conflict that cannot be resolved by changing shifters or the relative phase assignments, then the modified phase conflict process 150 notifies the physical design process 120 of the phase-shift conflict and provides information about the particular phase-shift conflict. The fabrication design process does not proceed with subsequent units in the hierarchy. In this way, phase-shift conflicts are found and resolved incrementally, before time and computational resources are expended attempting to place shifters and assign phases to them for all the phase-shifted features in the entire design layout.

Hierarchical Layouts

Figure 2:
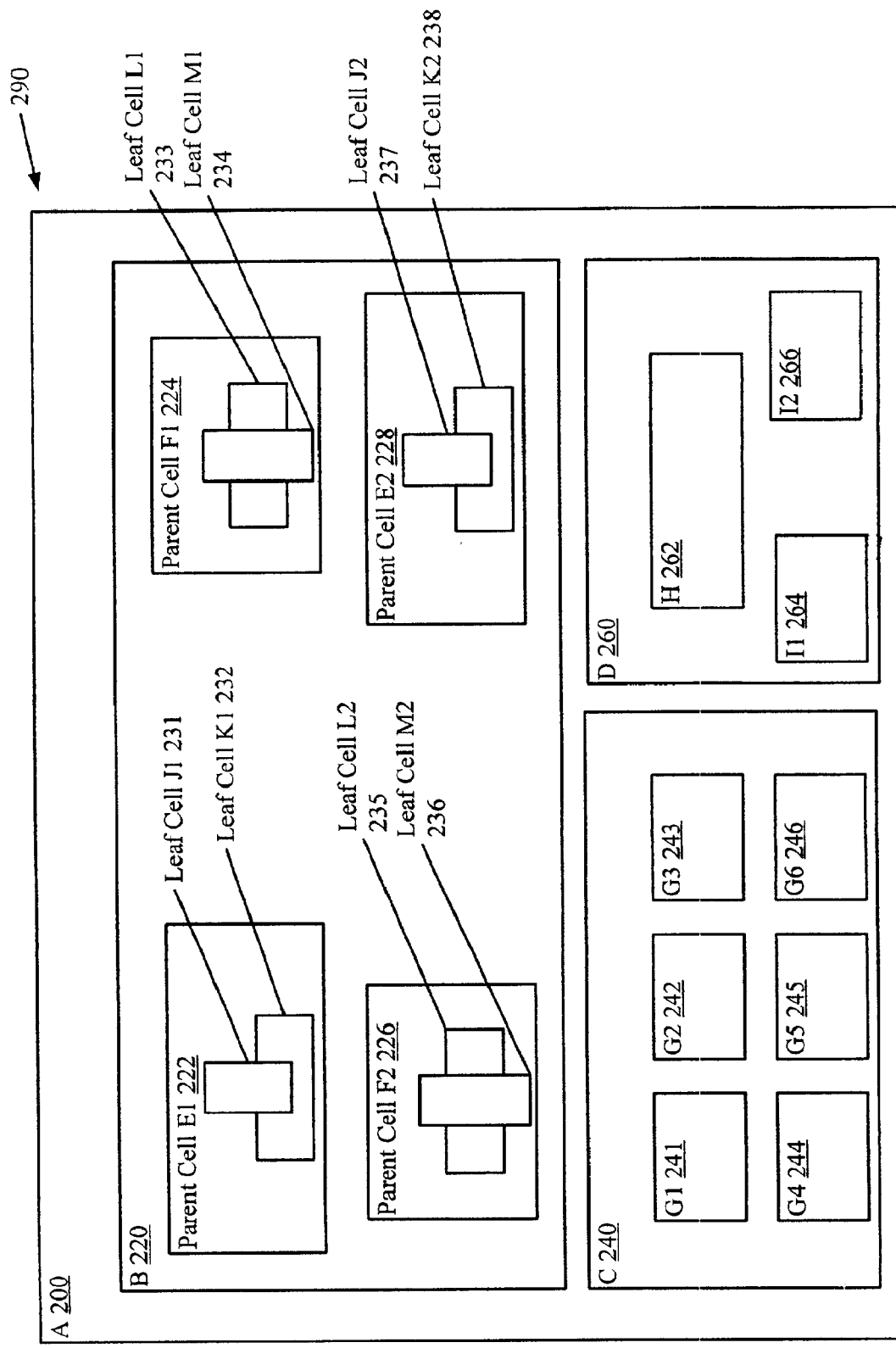
FIG. 2 is a plan view of an example design layout.
Figure 3:
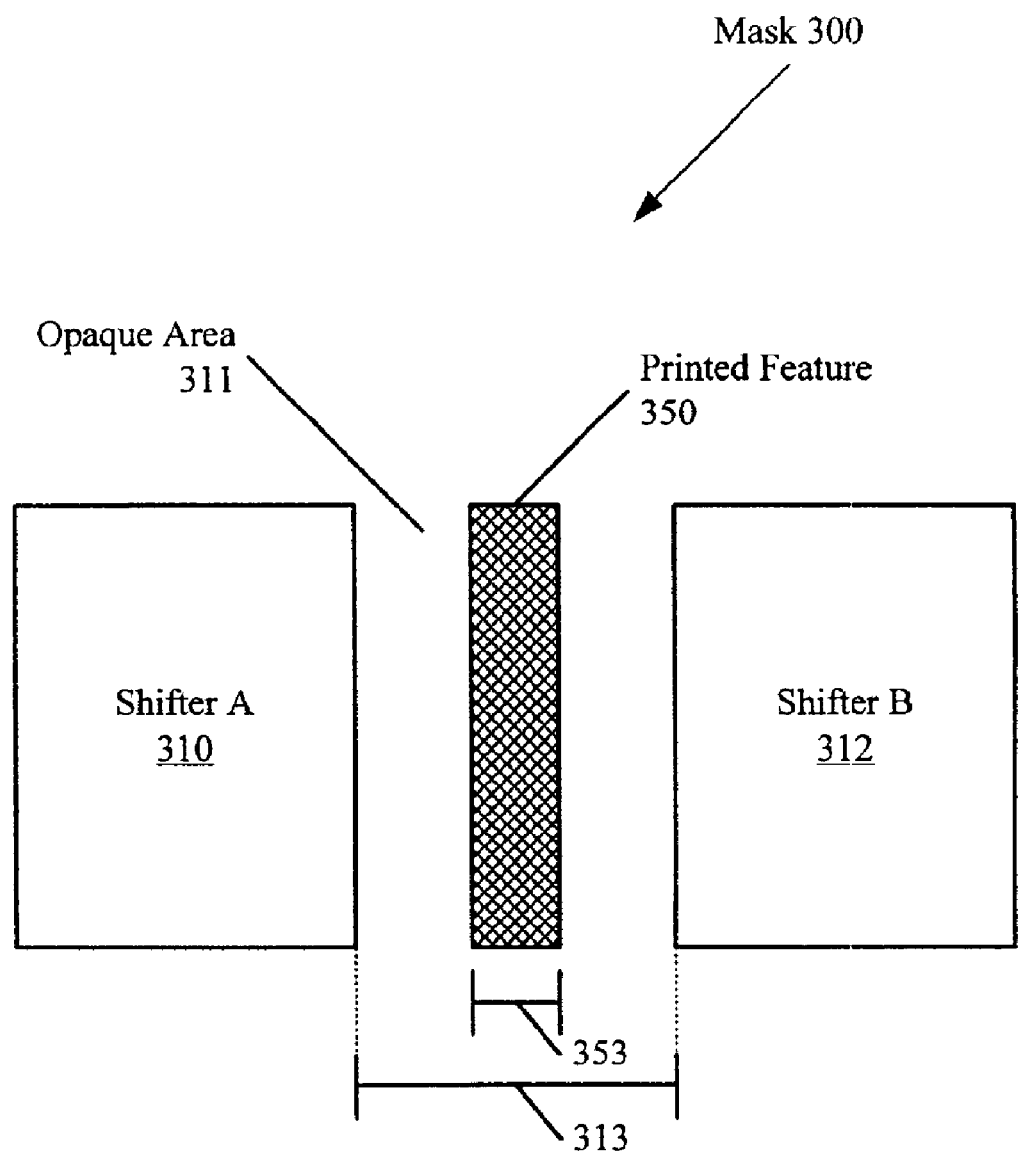
FIG. 3 is a plan view of two shifters on a mask and the resulting printed feature on the printed features layer.

A hierarchy can represent a layout. For example, as shown in FIG. 2, the circuit design layout 290 comprises a final cell, or hierarchical unit, A 200, which comprises sub-units B 220, C 240, and D 260 which are themselves parent cells for the units disposed in them. For example, parent cell C 240 comprises identical leaf cells G1 241, G2 242, G3 243, G4 244, G5 245 and G6 246, and parent cell F1 224 comprises leaf cells L1 233 and M1 234 which comprise the primitive geometric structures illustrated in FIG. 2A. Parent cell E1 includes leaf cells J1 231 and K1 232; and parent cell E2 includes leaf cells J2 237 and K2 238. Parent cell F2 226 includes leaf cells L2 235 and M2 236. Finally, parent cell D 260 includes identical leaf cells H 262, I1 264, and I2 266.

Figure 5:
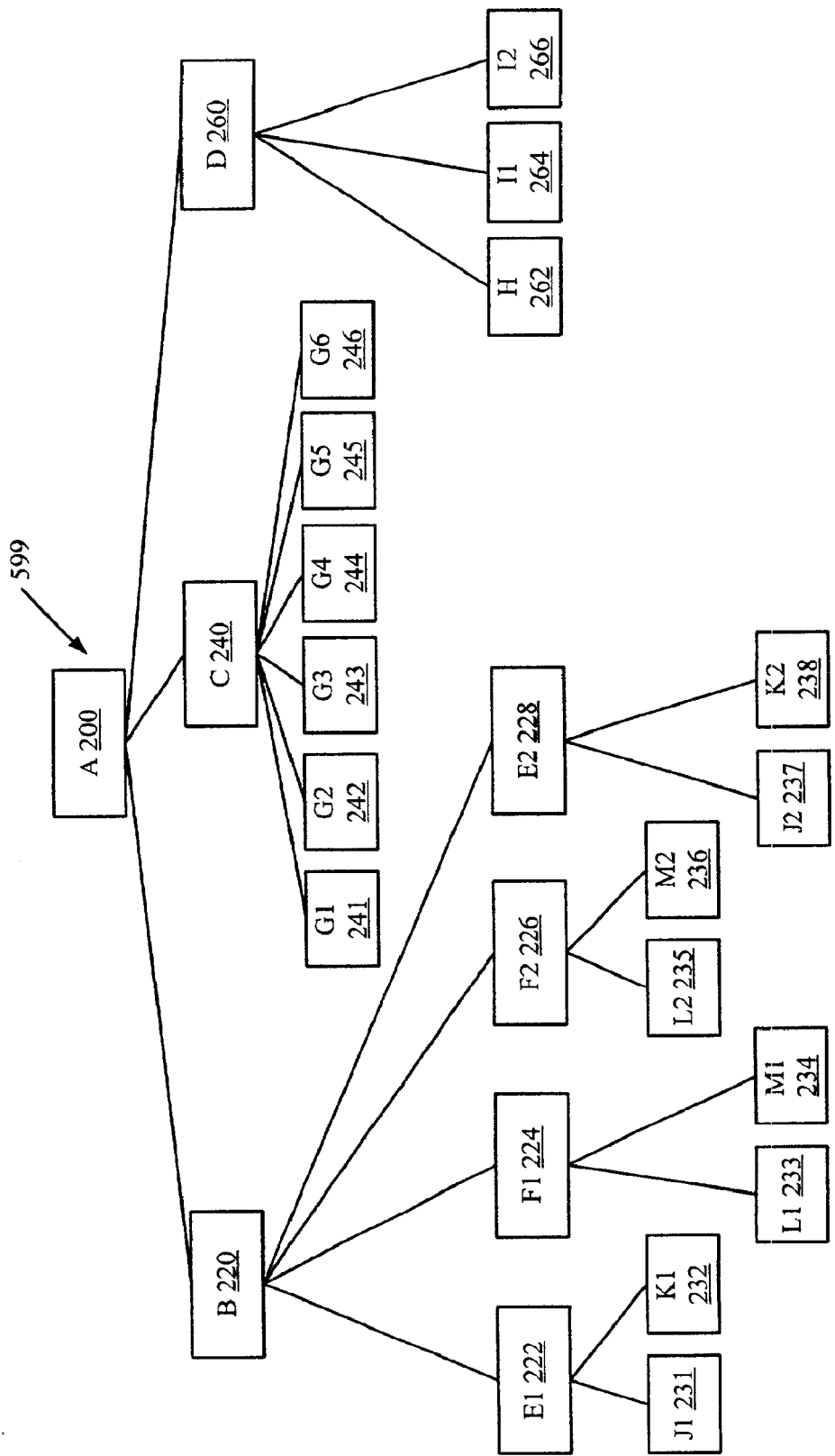
FIG. 5 is a diagram of the hierarchical tree representation of the design layout in FIG. 2.

The hierarchical tree layout 599, shown in FIG. 5, illustrates the described cells in a tree format with the leaf cells at the bottom of tree and with the final cell A 200 at the top of the tree. Each of the leaf cells is also sometimes referred to as the leaf node or a child cell, while each of the cells above the leaf nodes is sometimes referred to as a parent cell or simply a node. Any node can also be called a hierarchical unit of the design. The integrated circuit design layout 200 of FIG. 2 is provided simply to demonstrate the hierarchical nature of design layouts in general, and for integrated circuits in particular. The items on a mask can also be represented as hierarchical units, according to a related pending U.S. patent application Ser. No. 09/154,397 entitled "Method and Apparatus for Data Hierarchy maintenance in a System for Mask Description," filed on Sep. 16, 1998, invented by Fang-Cheng Chang, Yao-Ting Wang and Yagyensh C. Pati.

Modified Phase Conflict Process

The modified phase conflict process 150 operates incrementally on hierarchical units of the design layout. The described embodiment begins with a leaf cell and proceeds up the hierarchy to the root cell, but the process 150 can begin with any unit below the root cell. For example, if the design layout's hierarchy is represented by the tree in FIG. 5, the modified phase conflict process 150 of the described embodiment would first operate on one of the leaf cells, i.e. J1 231, K1 232, L1 233, M1 234, L2 235, M2 236, J2 237, K2 238, or G1 241, G2 242, G3 243, G4 244, G5 245, G6 246, or H 262, I1 264, I2 266. The selection of the first leaf cell, and the progression through other leaf cells, can be performed in any way known in the art. If the first leaf cell is J1 231, the described embodiment would select as the next unit another leaf cell, e.g., K1 232, which is combined with J1 231 by the next higher node in the hierarchy, i.e. E1 222. After these units are processed, the described embodiment would process unit E1 222. However, before processing unit B 220, the described embodiment first processes the other units, or nodes, combined by unit B 220, i.e. F1 224, F2 226, and E2 228. Since each of these units have subunits, their subunits should be processed before the respective units. Thus, in the described embodiment, leaf cells L1 233 and M1 234 are processed in turn before processing unit F1 224.

In another embodiment, the first node processed on a branch may be any node in the hierarchy below the root node A 200. However, if the first node selected is not a leaf cell, all the subunits in the first node are processed together. One or more other nodes are first processed on respective other branches in the tree. In the following discussion, the first node selected on any branch for processing is called a cell. For example, if B 220 is the first node processed on its branch, then all the nodes below B 220, i.e. E1 222, F1 224, F2 226, E2, 228, J1 231, K1 232, L2 235 M2 236, L1 233, M1 234, J2 237, and K2 238, are included in a cell. Other cells are needed, in this example, for the remaining branches to nodes C 240 and D 260 and below. For example, node C 240 may be processed first in its branch, making the nodes C 240, G1 241, G2 242, G3 243, G4 244, G5 245, and G6 246 one cell. In a contrasting example, the branch involving node D 260, first processes the leaf nodes, H 262, I1 264 and I2 266, making those the cells on their branches.

In one embodiment of the invention, shifters are initially placed in a cell, and in subsequent hierarchical units the shifters are corrected or assigned relative phases or both, but are not initially placed.

Figure 4A:
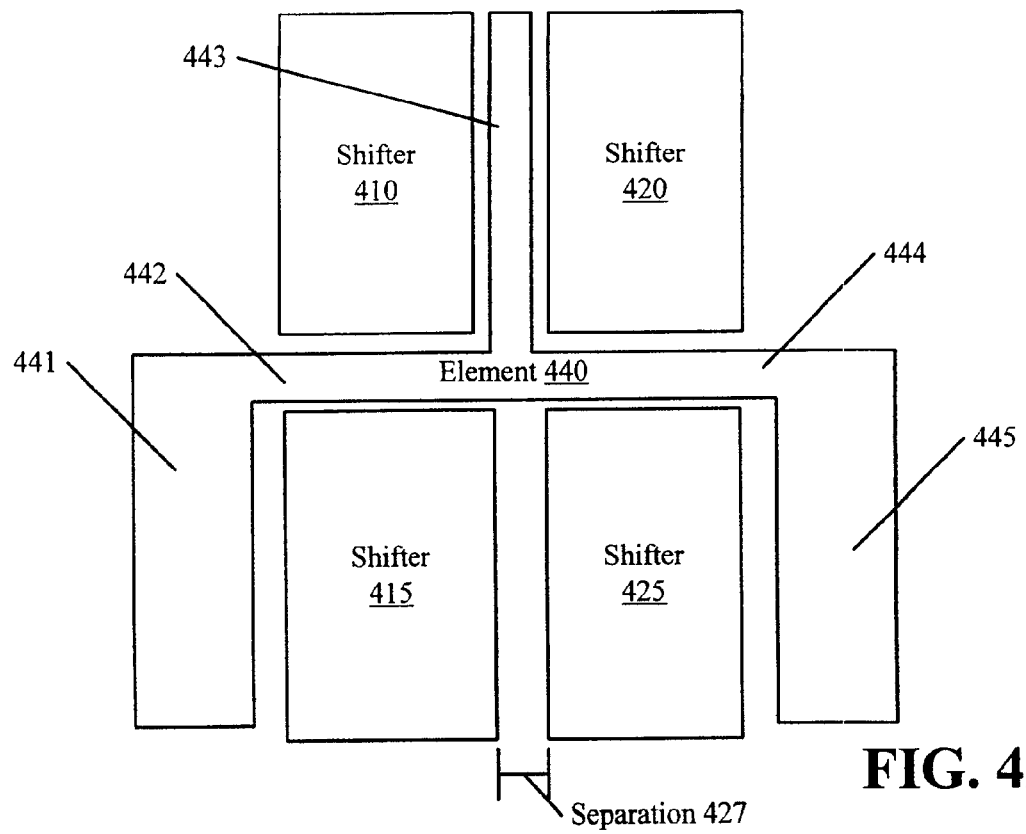
FIGS. 4A & 4B are plan views of example elements having features that employ shifters that lead to phase-shift conflicts.
Figure 6:
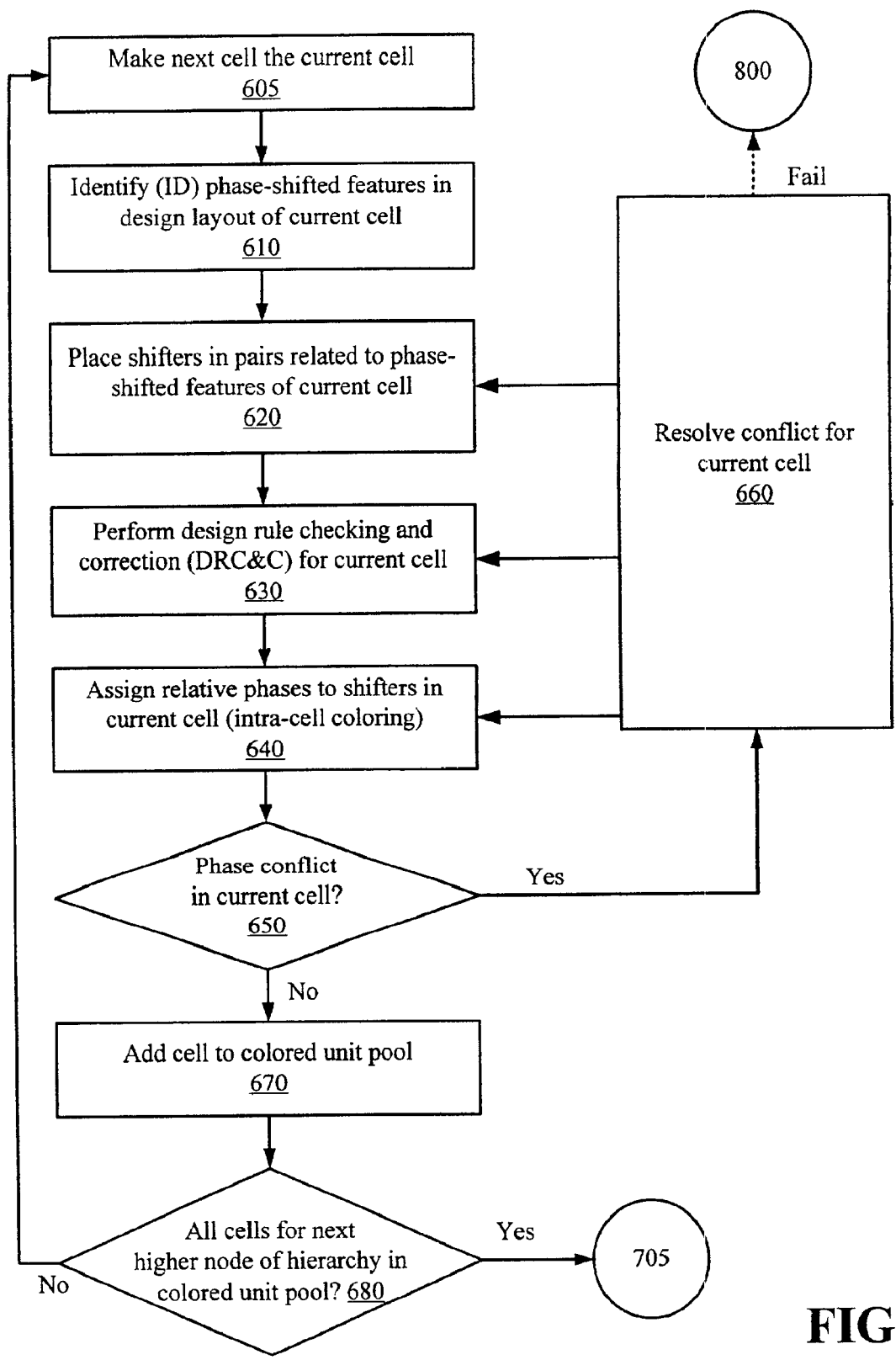
FIG. 6 is a flowchart illustrating the phase-shift conflict process at the cell level according to one embodiment.

FIG. 6 is a flowchart illustrating the phase-shift conflict process 150 at the cell level, according to one embodiment. This process can be executed in a computer system, such as the computer system shown in FIG. 10. In step 605 the process makes the next cell of the cells in the hierarchy the current cell for processing. In step 610 the process identifies shifted features in the current cell of the design layout. In step 620, the process places shifters in pairs, the shifter having shapes and positions related to the positions and shapes of the phase-shifted features in the current cell in ways known in the art. In step 630, the process performs design rules checking and correction (DRC&C) for the shifters of the current cell. For example, if step 620 placed shifters as shown in FIG. 4A , then the design rule that forbids spacing between two adjacent shifters from being smaller than a certain distance X would force the DRC&C step 630 to combine shifters 415 and 425 and derive a single shifter 430. The shifter 430 is derived from the initial shifters 415 and 425. In a trivial element of this process, shifters 410 and 420 are derived to be the same as their initial placement.

In step 640, the process assigns relative phases to the shifters in the current cell-this is called intra-cell coloring. Using relative phases, for each shifter pair, the two separate shifters adjacent to a single phase-shifted feature are assigned a phase difference of 180 degrees. This step can be accomplished using ways known in the art, such as the standard graph traversal algorithm. In the graph-traversal algorithm, a phase-assignment graph is constructed in which each given shifter is a node and adjacent shifters that constrain the phase of the given shifter are represented by links. Two kinds of links are represented, an opposite phase link and a same phase link. An opposite phase link is indicated to form a critical, phase-shifted feature. A same phase link is employed when two shifters (nodes) are close together without an intervening critical phase-shifted feature. The links represent the relative phases without fixing an absolute phase. An example of a phase-assignment graph is given in more detail in a later section.

Unlike conventional fabrication layout design, this embodiment separates the placement of shifters in step 620, as performed by a placement engine, for example, from the assignment of phases to the shifters in step 640, as performed by a coloring engine providing relative phases for the shifters, for example. By assigning relative phases in step 640, rather than absolute phases, this embodiment does not fix the absolute phase of the shifters; but, instead, allows the relative phases to be switched as needed to resolved future phase conflicts before fixing the absolute phases of the shifters in this cell. This process makes it easy to swap the phases of the necessary shifter pairs in the cell with a single command or notation, if that turns out to be needed to resolve some future phase-shift conflict.

Figure 4B:
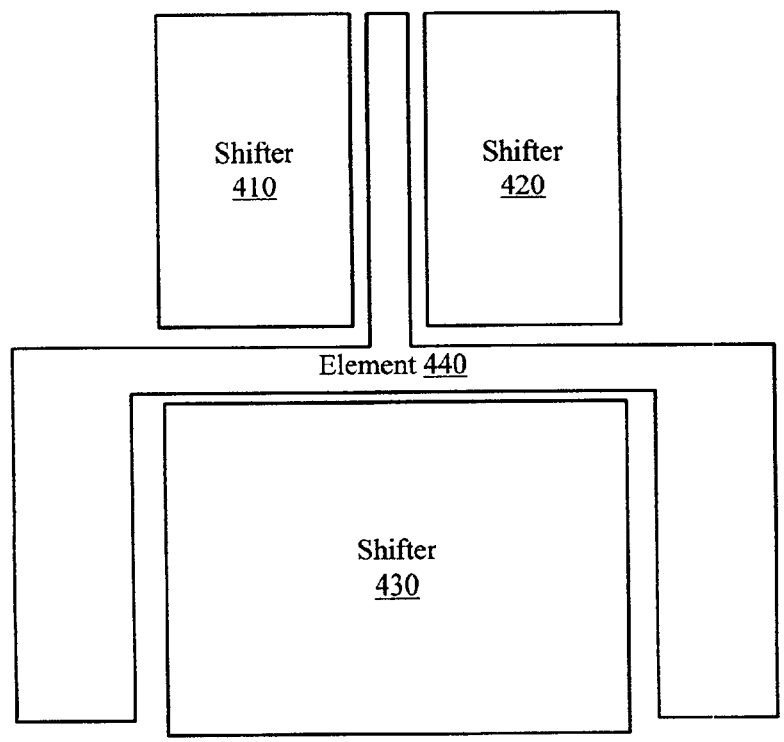

In step 650, the relative phases are used to determine whether there is a phase-shift conflict in the current cell. For example, FIG. 4A illustrates a feature 440 that leads to a phase-shift conflict as represented by FIG. 4B. This phase-shift conflict can be detected with the relative phases assigned to the shifters. Another common phase shift conflict arises with odd cycle shifters-a set of shifters in which an odd number of shifters are associated with closely spaced phase-shifted features.

Unlike conventional fabrication layout design processes, this embodiment detects a phase-shift conflict at the cell level, rather than after all shifters have been placed and assigned absolute phases for the whole design layout. Consequently, a phase-shift conflict resolution can be attempted at the level of the current cell, which is a simpler problem than resolving phase-shift conflicts for the entire design layout.

If no phase-shift conflict remains in the current cell, then control passes to step 670 in which the current cell is added to a pool of successfully colored hierarchical units. Units are successfully colored if relative phases can be assigned that do not cause phase-shift conflicts. The colored unit pool may be maintained in memory or on permanent storage device accessible to the fabrication layout design process 130. In step 680 of this embodiment, it is determined whether all the cells for the next higher node of the hierarchy are available in the colored unit pool. If they are, then processing can begin for the next higher node in the hierarchy. If all the cells needed by the next higher node in the hierarchy are not already in the colored unit pool, then another cell needed by the next higher node is made the current cell in step 605.

If it is determined in step 650 that there is a phase-shift conflict in the current cell, then control passes to step 660, which attempts to resolve the conflict for the current cell within the fabrication layout design process 130. It is assumed in this embodiment that the fabrication layout design process 130 can change the position or shape of shifters, consistent with the shifter design rules, and can change the relative or absolute phases of the shifters, but cannot change the position or shape of features that appear in the design layout 125 for a printed features layer 149. Step 660 includes any methods known in the art to resolve phase-shift conflicts within the fabrication layout design process. Known methods include replacing an offending shifter with a stored shifter that is differently positioned or shaped, breaking up odd cycle shifters by replacing one of the shifters in the combination with two separated shifters, and obtaining manual input from an operator to re-shape or re-position or break-up a shifter or to provide relative phase information for a shifter. Another method is to allow two opposite-phase shifters to produce a spurious feature, and then to expose the spurious feature in a different stage of the fabrication process to cause the removal of the spurious feature. The two opposite-phase shifters result either from splitting one shifter in two, or allowing two shifters to be positioned closer than a design rule limit without joining the two shifters.

Another method to resolve phase-shift conflicts within a hierarchical unit involves introducing one or more new variants of a standard cell in the hierarchical unit. Each variant has one or more pairs of shifters reversed from their phases in the standard cell. This method involves replacing a standard cell with one of its variants in the hierarchical unit.

If step 660 is able to modify the shifter layout for the cell, control passes to step 620 to place the shifters in the case in which a shifter shape has been changed. If step 660 also specified positions for the shifters, control returns to step 630 to perform DRC&C for the cell. If step 660 also overrules DRC&C, control will pass back to step 640 to assign relative phases. The new arrangement of shifters and phases is checked for phase-shift conflicts in step 650.

If step 660 is unable to provide different shifter shapes or positions, or if repeated changes to shifter shapes and positions do not remove all phase-shift conflicts in the current cell, then step 660 is unable to resolve the phase-shift conflict for the current cell, and step 660 fails. Upon failure of step 660 to resolve one or more phase-shift conflicts in the current cell, control passes to a point in the physical design process 120 represented by transfer point 800 in FIG. 6. The physical design process 120 then rearranges features in the design layout 125.

Figure 7:
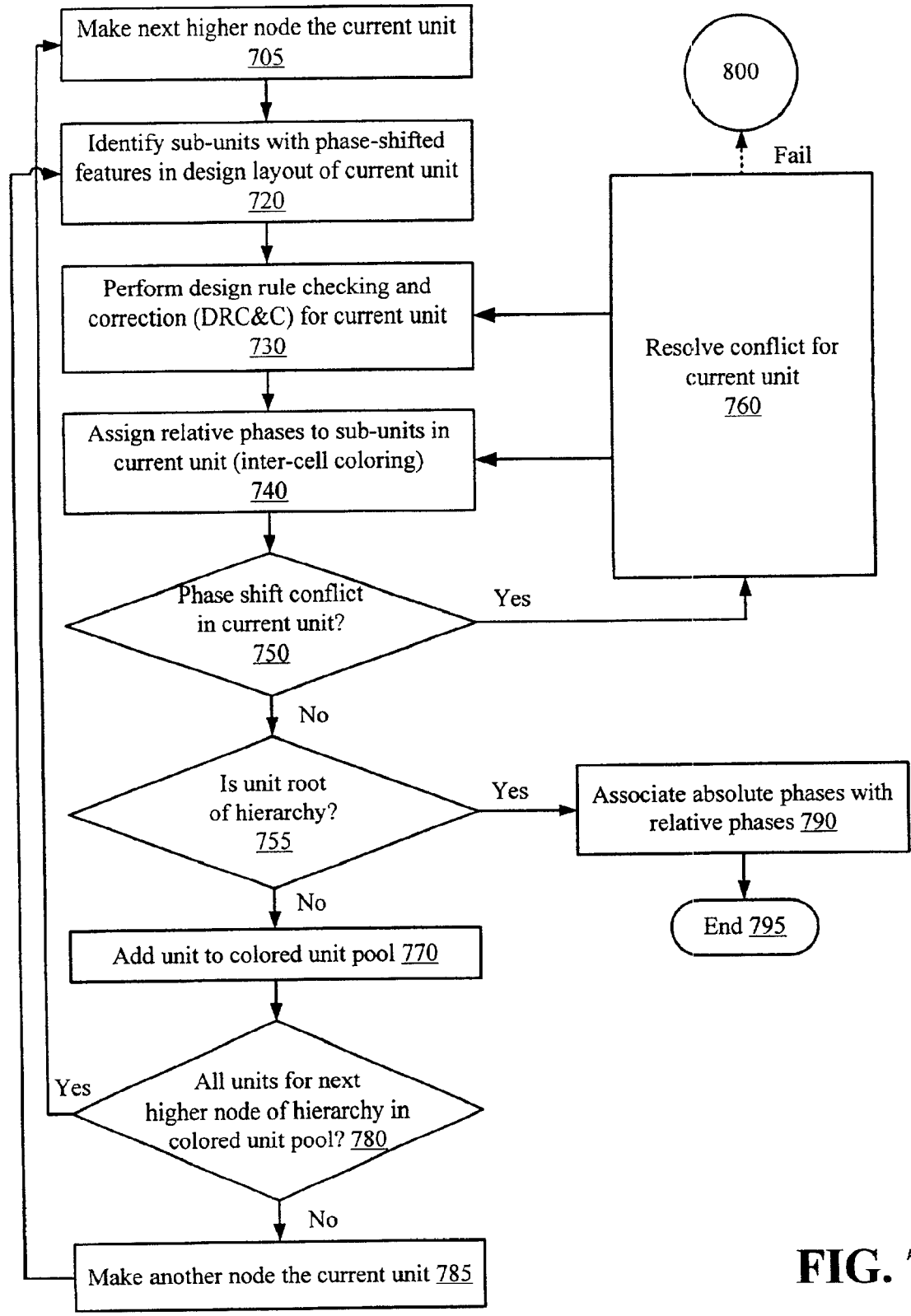
FIG. 7 is a flowchart illustrating the phase-shift conflict process at a hierarchical unit above the cell level according to an embodiment.

FIG. 7 is a flowchart illustrating the phase-shift conflict process 150 at a general hierarchical unit level, according to one embodiment of the present invention. At step 705 the process makes the next higher node the current unit, such as when all the cells within a parent node have been processed. If the general hierarchical unit is a cell first being processed, then step 705 can be skipped. In step 720 the process identifies subunits with phase-shifted features in the design layout of the current unit. If the current unit is the first cell being processed on its branch, then shifters have to be placed for the phase-shifted features, as shown in FIG. 6. However, if the current unit is made up of subunits that have already been processed, then the shifters for the phase-shifted features have already been initially placed.

In step 730, DRC&C is performed on the shifters for the current unit. During this step a shifter smaller than the allowed minimum width, or spacing between two shifters that is smaller than the allowed minimum spacing X, will be discovered and corrected, for example.

In step 740, the shifters in all the subunits in the current unit will be assigned relative phases, not by reassigning the relative phase of all shifters in the unit, but by adjusting the relative phase between subunits, e.g., by recording that a first subunit is 180 degrees out of phase from a second sub-unit —this is called inter-cell coloring. In one embodiment, inter-cell coloring is accomplished by simply reversing the polarity of the needed relative phases of a subunit. This preserves the relative phases of all the shifters within the subunit. In another embodiment this is accomplished by adding a link between nearby shifters in the phase-assignment graph for this current hierarchical unit.

Unlike conventional fabrication layout design processes, this embodiment provides relative phase information separately from positioning the shifters. Moreover, this embodiment provides a way of incrementally building up the relative phase information from lower hierarchical unit levels all the way to the top level. Again, as above, by assigning relative phases in step 740, rather than absolute phases, this embodiment does not set the absolute phase of the shifters; but, instead, allows the relative phases to be switched as needed to resolve future phase conflicts in higher units in the hierarchy before fixing the absolute phases of the shifters in this unit. This embodiment makes it easy to swap the phases of all the shifters in the unit with a single command or notation, if it turns out to be needed to resolve some future phase-shift conflict at a unit higher in the hierarchy of the design layout.

In step 750, the relative phases are used to determine whether there is a phase-shift conflict in the current unit. Unlike conventional fabrication layout design processes, this embodiment detects a phase-shift conflict at the unit level, rather than after all shifters have been placed and assigned absolute phases for the whole design layout. Consequently, a phase-shift conflict can be detected early. In addition, the phase-shift conflict resolution can be attempted at the level of the current unit, which is a simpler problem than resolving phase-shift conflicts for the entire design layout.

If it is determined in step 750 that there is a phase-shift conflict in the current unit, then control passes to step 760, which attempts to resolve the conflict for the current unit within the fabrication layout design process 130. As in step 660 above, step 760 is not limited to any particular technique for resolving phase-shift conflicts within a fabrication layout design process. If step 760 is able to modify the shifter layout for the unit, control passes to step 730 to perform DRC&C for the unit. If step 760 involves a method that overrules a design rule usually applied during DRC&C, control will pass back to step 740 to assign relative phases. The new arrangement of shifters and phases is then checked for phase-shift conflicts in step 750.

If the methods applied in step 750 are unable to provide different shifter shapes or positions, or if repeated changes to shifter shapes and positions do not remove phase-shift conflicts in the current unit, then step 760 fails. Upon failure of the methods applied in step 760 to resolve phase-shift conflicts in the current unit, control passes to a point in the physical design process 120 represented by transfer point 800 in FIG. 7. The physical design process 120 then rearranges features in the design layout 125, if possible and permitted.

If no phase-shift conflict remains in the current unit, then control passes to step 755. If the current unit is the root unit of the hierarchy, then the fabrication layout design is complete and without phase-shift conflicts; thus the fabrication layout design process 130 has successfully produced fabrication layout 135. Step 755 determines whether the current unit is a root unit of the hierarchy. If it is determined in step 755 that the current unit is the root unit, then control passes to step 790. In step 790, absolute phases are associated with the relative phases assigned to each shifter in the fabrication layout 135, the fabrication layout 135 is stored, and the fabrication design process ends successfully at point 795.

If the current unit is not the root unit of the hierarchy, then control passes to step 770 in which the current unit is added to the pool of successfully colored units. Control then passes to step 780, in which it is determined whether all units for the next higher node in the hierarchy are already in the colored unit pool. If all units for the next higher node are already in the colored unit pool, then the next higher node is made the current unit, by passing control to step 705. If all units for the next higher node are not in the colored unit pool, then another node needed by the next higher node is made the current unit, in step 785.

In this way, hierarchical units with relative phases assigned, and with no phase conflicts, are accumulated in the colored units pool. The units in this pool represent resources that can be readily re-used in other designs, because they are known to be free of internal phase-shift conflicts.

Conflict Sensitive Compaction

Figure 8A:
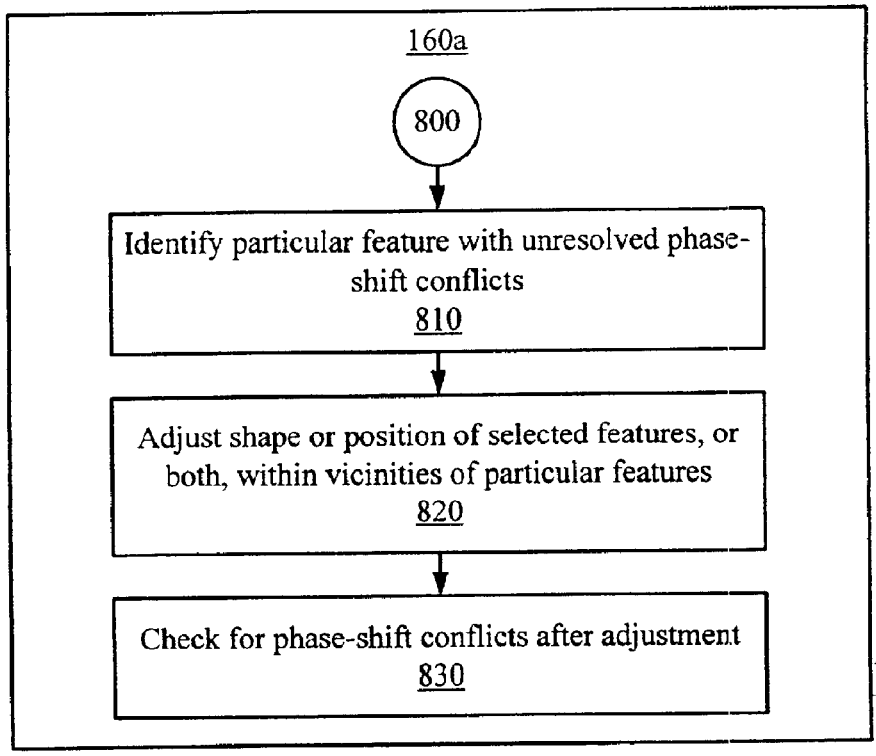
FIGS. 8A, 8B and 8C are flowcharts illustrating the steps for the modified design layout process according to embodiments.

The physical design process 120 is modified to include conflict sensitive compaction 160 in an embodiment of the invention. FIG. 8A is a flowchart illustrating steps for a modified design layout process according to one embodiment of the invention. In this embodiment, control passes to transfer point 800 when the fabrication design process is unable to resolve a phase-shift conflict. In step 810, the process identifies particular features with unresolved phase-shift conflicts based on information received from the fabrication layout design process 130. If a conventional fabrication design process were employed, this information first becomes available only for the entire design layout. However, in this embodiment, the information about a phase-shift conflict becomes available for the first hierarchical unit that encounters an irresolvable phase-shift conflict. Herein, an irresolvable phase-shift conflict indicates a phase-shift conflict that could not be resolved by the fabrication design process. In the described embodiment, the information includes identification of the hierarchical unit in which the irresolvable phase-shift conflict was found. In another embodiment, the information includes the amount of space needed to resolve the conflict with additional shifters. In another embodiment, the information includes a list of features linked by a loop in a phase-assignment graph with the feature having the phase-shift conflict.

In step 820, the process adjusts the design layout based on the information provided about the particular phase-shift conflicts, and produces an adjusted design layout, 125*b*. In one embodiment, the adjustment is confined to the features within the same hierarchical unit that encountered the irresolvable phase-shift conflict. In an alternative embodiment, the adjustment is confined to selected features within a given distance of the particular features identified as having unresolved phase-shift conflicts. The particular feature is included among the selected features. Unlike the conventional design process, which addresses phase-shift conflicts throughout the entire design layout, these embodiments employ the design process 120 to solve a much smaller problem, one confined to a single unit in the hierarchy of the design layout, or one confined to a given distance from the particular features identified with the phase conflict, or one confided to a subset of features logically related by a loop in a graphical representation of relationships among shifters.

Different procedures can be used to adjust features in the hierarchical or spatial vicinity of the phase-shift conflict. In one embodiment, the design layout in the vicinity is computed using the original design rules that produced the original design layout, such as the original process-specific design rules, if several viable layouts are produced by those design rules. In this case, it is suggested that a different viable layout be used than was used to produce the original layout. However, if this method is used, there is no significantly improved likelihood that the new design will avoid a phase conflict. In some embodiments, such as where several viable solutions occur, multiple potential solutions to a phase conflict are generated based on the logically associated features. For example, a different one of the associated features can be fixed in position for each different potential solution or set of potential solutions. The potential solutions are evaluated to produce a set of one or more values per solution. For example, the set of values includes the total area of the design associated with the potential solution design in one embodiment. In other embodiments, the set of values includes the number of features to move and the number of phase shift conflicts remaining. The potential solution providing a most favorable set of values is picked. For example the potential solution associated with the smallest area or fewest features moved or fewest remaining conflicts is picked.

If another viable solution is tried, one embodiment adds step 830 to place and color shifters according to the adjusted layout, and then check for phase-shift conflicts in the adjusted layout. If phase-shift conflicts are still found in the adjusted layout, then another layout is selected from the viable layouts provided by the original design rules. The process continues until a viable layout is found which does not produce a phase-shift conflict, or until the supply of viable options is exhausted.

Figure 8B:
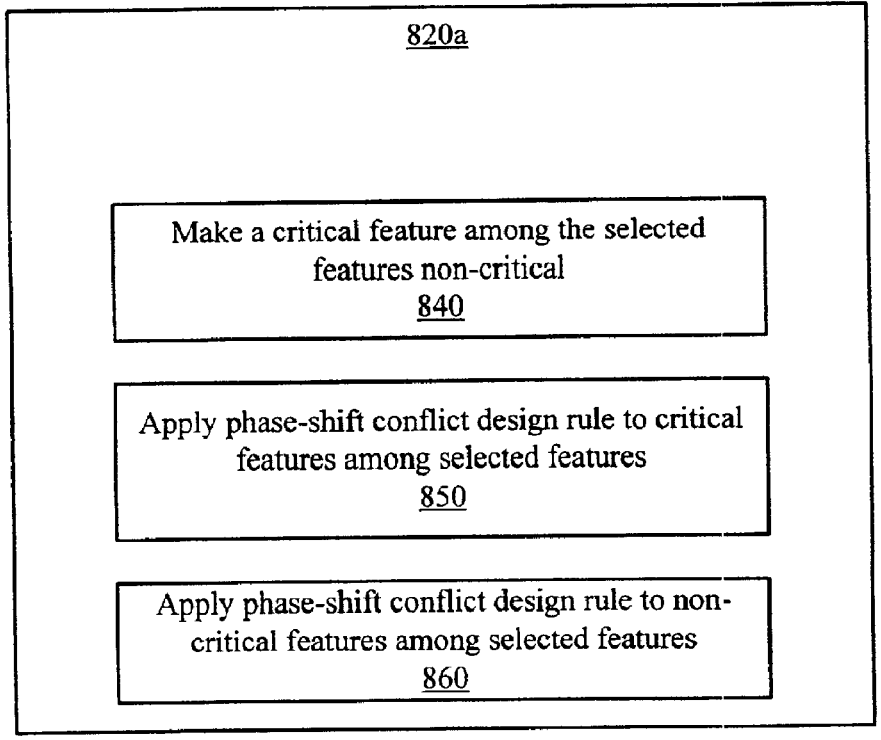

FIG. 8B shows the steps that are used in an alternative embodiment of step 820, designated step 820*a*, to adjust selected features within the vicinity of phase-shift conflicts.

In step 840, a critical feature among the selected features is made non-critical. Herein a critical feature is one that is to be defined using the phase shifting mask; thus a non-critical feature is one that will be defined using the corresponding trim mask. The ability of an adjustment making a critical feature non-critical to remove phase-shift conflicts is illustrated in FIGS. 9A and 9B.

Figure 9A:
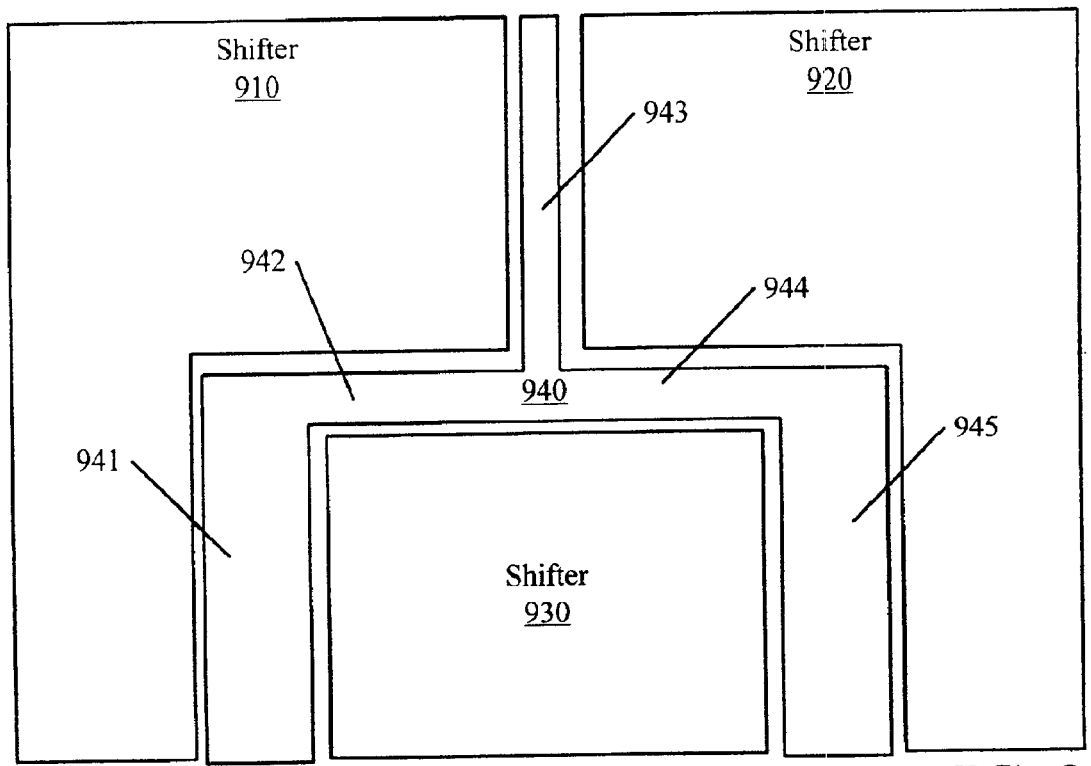
FIGS. 9A, 9B and 9C show plan views of elements of a printed features layer adjusted according to the design layout process of embodiments.
Figure 9B:
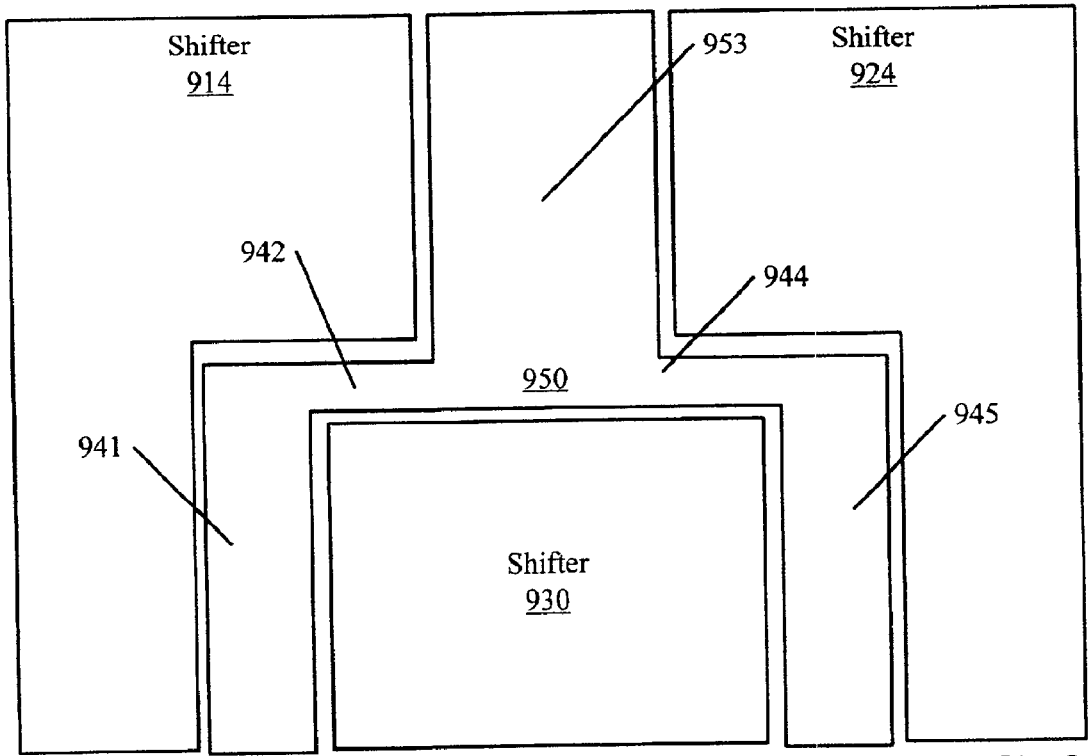

FIG. 9A shows an element 940 with five critical features 941, 942, 943, 944 and 945. Shifters 910 and 920 have opposite phases to form critical feature 943. This element leads to a phase-shift conflict because shifter 930 cannot simultaneously have opposite phase from both shifters 910 and 920. This phase-shift conflict was not resolvable by the fabrication layout design process 130 because there was no room to insert another shifter or split shifter 930. According to this embodiment, feature 943 can be made non-critical. In this case, illustrated in FIG. 9B, non-critical feature 953 replaces critical feature 943 in element 950. As a consequence, shifters 910 and 920 can be replaced by shifters 914 and 924 spaced farther apart. In addition, there is no longer a requirement for shifters 914 and 924 to have opposite phase. When placed and colored in the fabrication layout design process 130, shifters 914 and 924 may be given the same phase, and shifter 930 may assume an opposite phase to both, thus resolving the phase-shift conflict.

It is appropriate to have new design rules that demand more space for placing features if such design rules are applied only in the context of phase-shift conflicts, because the benefit of removing the phase-shift conflict is considered worth the expenditure of extra layout area. Sample new design rules include placing edges farther apart on features in the vicinity of an irresolvable phase-shift conflict, and placing critical features father apart in the vicinity of an irresolvable phase-shift conflict. In step 850, new design rules applicable in phase-shift conflict situations are applied to critical features among the selected features. In step 860, other new design rules applicable in phase-shift conflict situations are applied to non-critical features among the selected features. Steps 850 and 860 are separate to allow the new phase-shift conflict design rules to be different for critical features and for non-critical features.

Figure 9C:
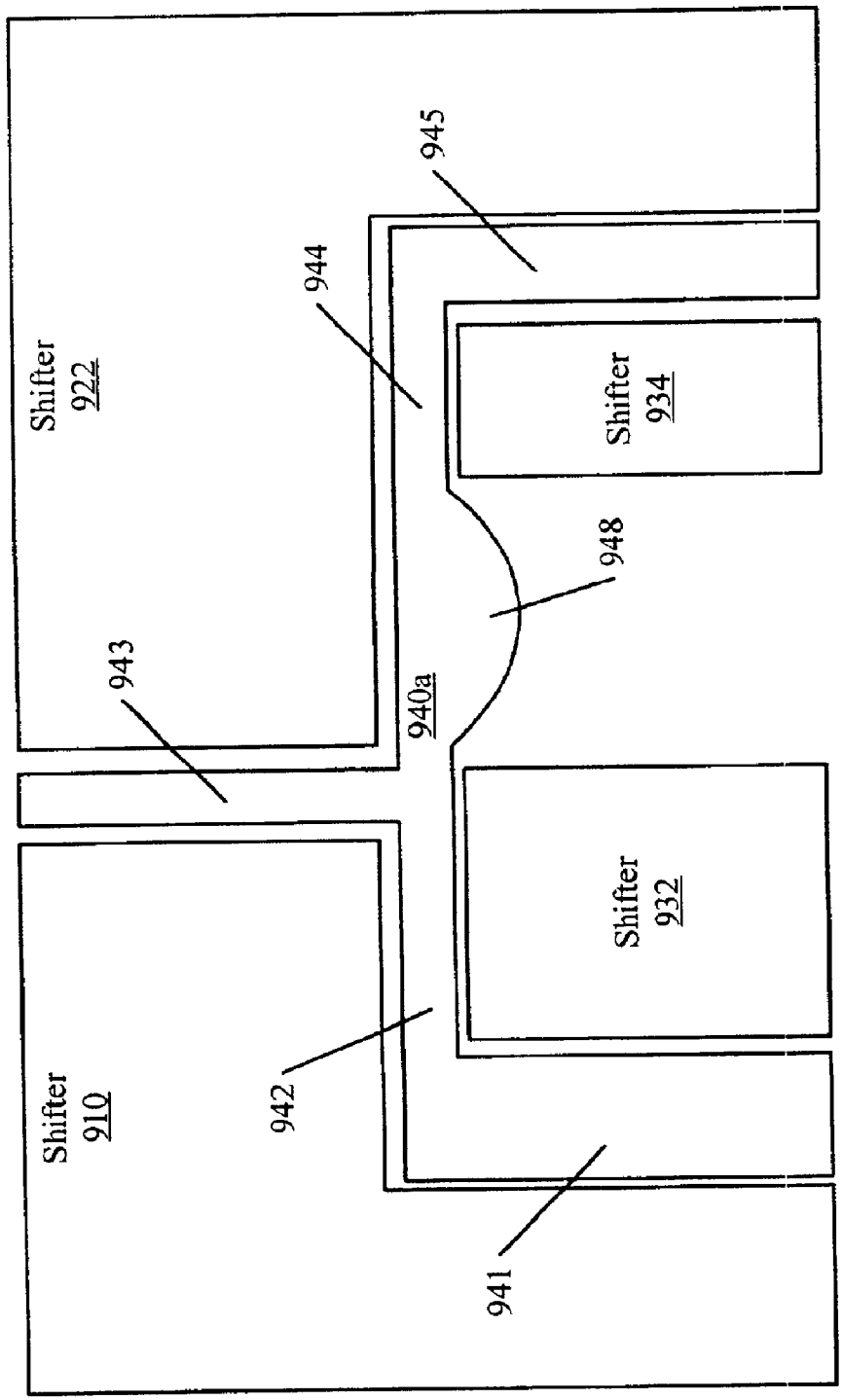

FIG. 9C illustrates how new design rules for critical features in the vicinity of a phase-shift conflict can resolve a phase-shift conflict. In this case, the phase-shift conflict caused by the element 940 in FIG. 9A, is communicated by the fabrication layout design process 130 to an embodiment of process 160*a* that includes step 850. Based on the information about the phase-shift conflict, in step 850, the process applies a new design rule calling for greater separation between critical features than called for in the original design rules. This causes features 945 and 944 to be moved further away from features 941, 942 and 943 in the adjusted design layout, as shown in FIG. 9C. With this arrangement, shifter 930 can be replaced by two separate shifters 932 and 934, which are far enough apart to have opposite phases from each other. With the extra space in this arrangement of shifters, the coloring engine can assign shifters 910 and 934 a first phase, and assign shifters 932 and 922 the opposite phase. Then phase shifted feature 943 can be produced by the opposite phases of shifters 910 and 922. Simultaneously, phase-shifted features 942 and 941 can be produced by the opposite phases of shifters 910 and 932; while phase-shifted features 944 and 945 can be produced by the opposite phases of shifters 922 and 934. The resulting element 940*a* includes a non-critical feature 948 between the critical features 942 and 944 in the gap caused by separating shifters 932 and 934.

A characteristic of the new design rules is the expected increase in layout area associated with the adjusted layout compared to the original layout. For example, the layout area associated with FIG. 9C is greater than layout area associated with FIG. 9A. It is possible that the physical layout design process can compensate for this increased area by the rearrangement of other features so that the total area for a cell or hierarchical unit of the design layout is not increased. In a sense, the cell or unit is re-compacted to accumulate space in the vicinity of the features associated with an irresolvable phase conflict. This accumulation of space or increase in layout area or both is herein termed reverse compaction.

Figure 8C:
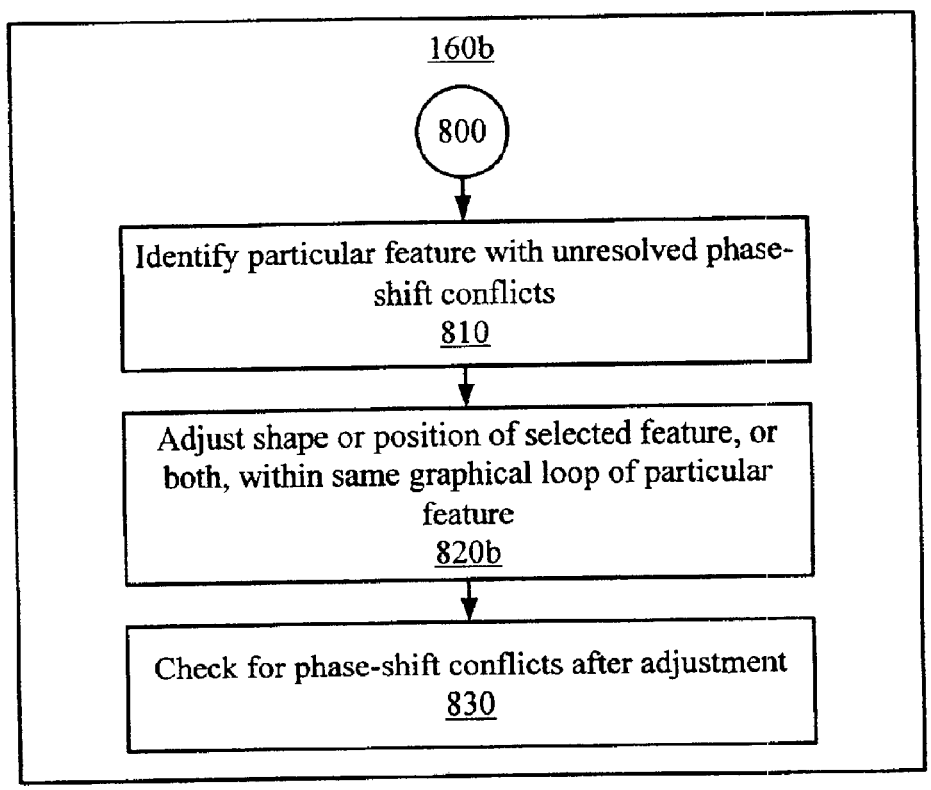

FIG. 8C is a flowchart illustrating steps for a modified design layout process according to another embodiment of the invention. As in FIG. 8A, control passes to transfer point 800 when the fabrication design process is unable to resolve a phase-shift conflict. In step 810, the process identifies particular features with unresolved phase-shift conflicts based on information received from the fabrication layout design process 130. In this embodiment, the information includes a list of features in the same graphical loop of a phase-assignment graph.

In step 820*b*, the process adjusts the design layout based on the information provided about the particular phase-shift conflicts, and produces an adjusted design layout, 125*b*. In this embodiment, the adjustment is confined to features in the same graphical loop of related shifters, regardless of whether these features are neighbors or whether the features are within a specified distance of the irresolvable phase-shift conflict, or even whether they are in the same hierarchical subunit. In the described embodiment, the loop includes shifters in the same hierarchical subunit. The particular feature is included among the selected features. If this method is used, there is a significantly improved likelihood that the new design will avoid a phase conflict. If a critical feature is moved, however, there is a chance that a shifter is placed close to another shifter that can lead to a phase-shift conflict. Therefore, another embodiment using this method adds step 830 to place and color shifters according to the adjusted layout, and then check for phase-shift conflicts in the adjusted layout. If phase-shift conflicts are still found in the adjusted layout, then another of the selected features is made modified. The process continues until a modification is found which does not produce a phase-shift conflict, or until the list of features on the same graphical loop is exhausted. The steps to adjust selected features shown in FIG. 8B for step 820*a* may also be used in step 820*b*. An example of this embodiment is illustrated with respect to FIGS. 9D, E and 9F.

Figure 9D:
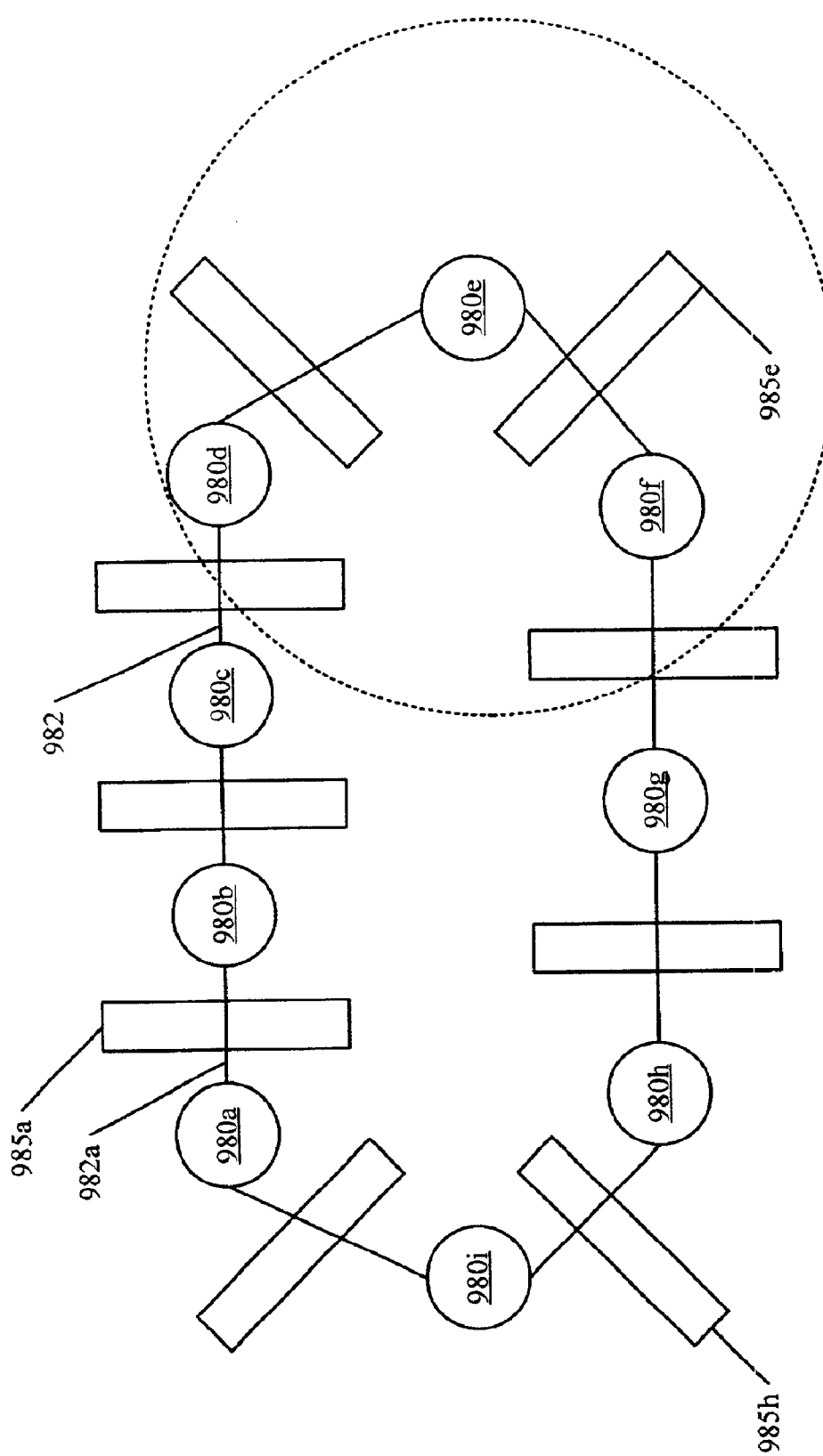
FIG. 9D shows a phase assignment graph associated with a hierarchical unit having a phase shift conflict.

FIG. 9D shows nine critical features 985 and a corresponding phase-assignment graph. The phase assignment graph is made up of nodes 980 representing shifters and links. In this example, each link 982 is an opposite phase link, connecting shifters that have opposite phases to produce the nine critical features. For example, link 982*a* indicates that the shifter at node 980*a* and the shifter at node 980*b* have opposite phases to form the critical feature 985*a*. This phase assignment graph is an example of an odd-cycle graphical loop that constitutes a detectable phase-conflict. To illustrate the conflict, assume that the shifter at node 980*a* is given a first phase value (either 0 or 180). Then the shifters at nodes 980*b* and 980*i* have the second phase value, and the shifters at nodes 980*c* and 980*h* have the first phase value, and the shifters at nodes 980*d* and 980*g* have the second phase value, and the shifters at nodes 980*e* and 980*f* have the first phase value. This leads to a phase-shift conflict at 985*e*, because opposite phases are needed in the shifters at nodes 980*e* and 980*g* to form the critical feature 985*e*, yet the shifters at nodes 980*e* and 980*f* have the same phase. It is assumed that this phase-shift conflict was not resolvable by the fabrication layout design process because there was no room to insert another shifter or split shifters at either node 980*e* or 980*f*.

According to this embodiment, any feature formed by the shifters on the graphical loop of FIG. 9D may be moved or made non-critical to resolve this conflict. It is not necessary that that the adjusted feature be within a certain distance of the feature having the conflict. For example, it is not necessary that the adjusted feature be within circle 987 centered on critical feature 985*e*. It is also not necessary that the adjusted feature be within the same hierarchical subunit of the feature having the conflict. For example, the graphical loop of FIG. 9D may span several hierarchical subunits, such as parent cells E1, F1, E2 and F2 of FIG. 2.

Figure 9E:
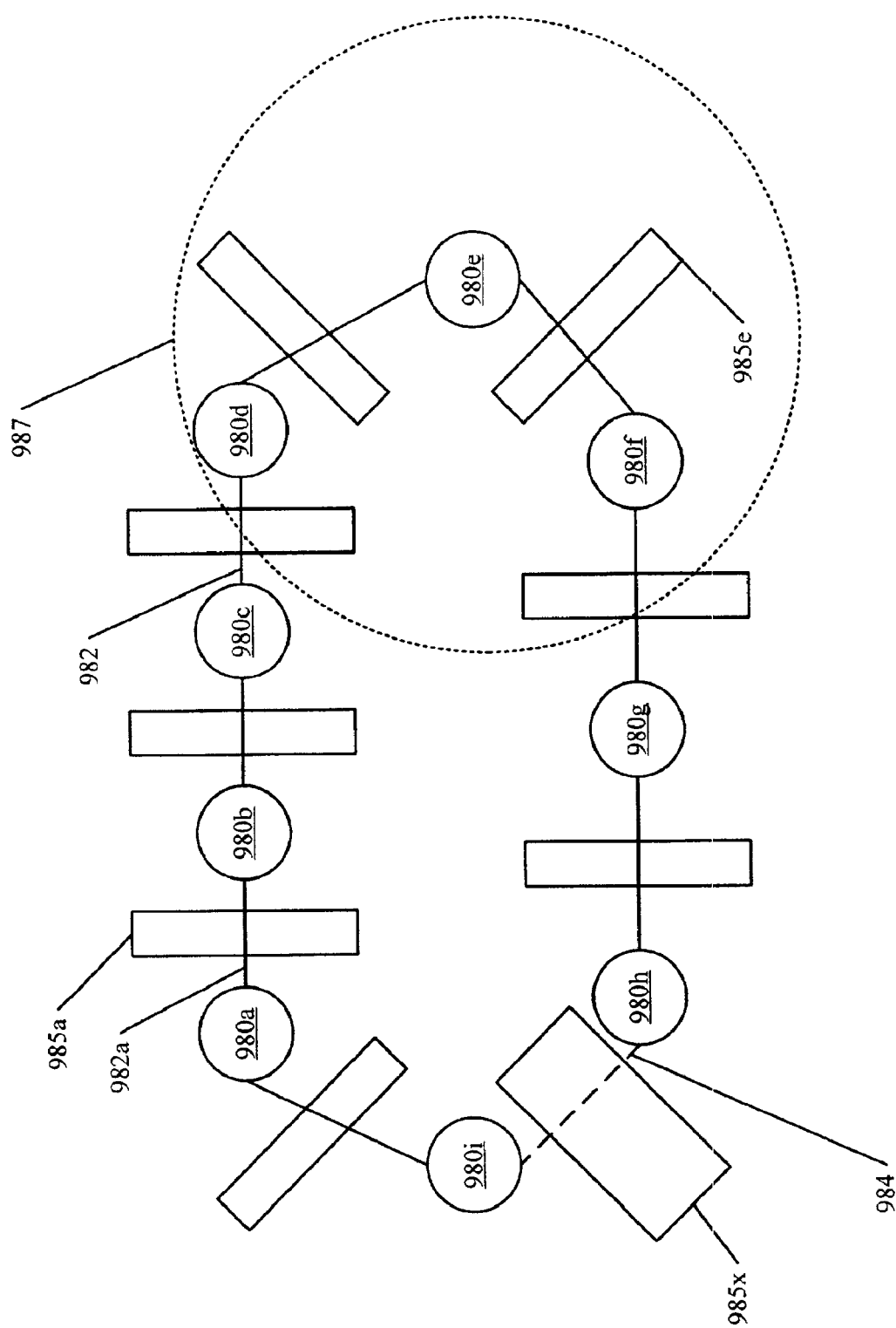
FIG. 9E shows a phase assignment graph associated with the hierarchical unit that resolves the phase conflict according to one embodiment.

For example, as illustrated in FIG. 9E, non-critical feature 985*x* replaces critical feature 985*h*. As a consequence, shifters at nodes 980*i* and 980*h* can have the same phase value, resolving the phase shift conflict on the loop. Shifter having the same phase are indicated by a different link 984, indicated in FIG. 9E by the dashed line segment. Effectively, shifters at nodes 980*i* and 980*h* can be combined, reducing the number of shifters to 8 and eliminating the odd-cycle graphical loop. If the shifters do not form a critical feature and are far enough apart, no link at all needs to connect them and each is free to assume any value. If this were the case, no link would connect nodes 980$h$ and 980$i$. Note that the feature adjusted is neither in the same hierarchical subunit nor within the circle 987 centered on the particular feature 985$e$ originally identified as having the unresolved phase-shift conflict.

Figure 9F:
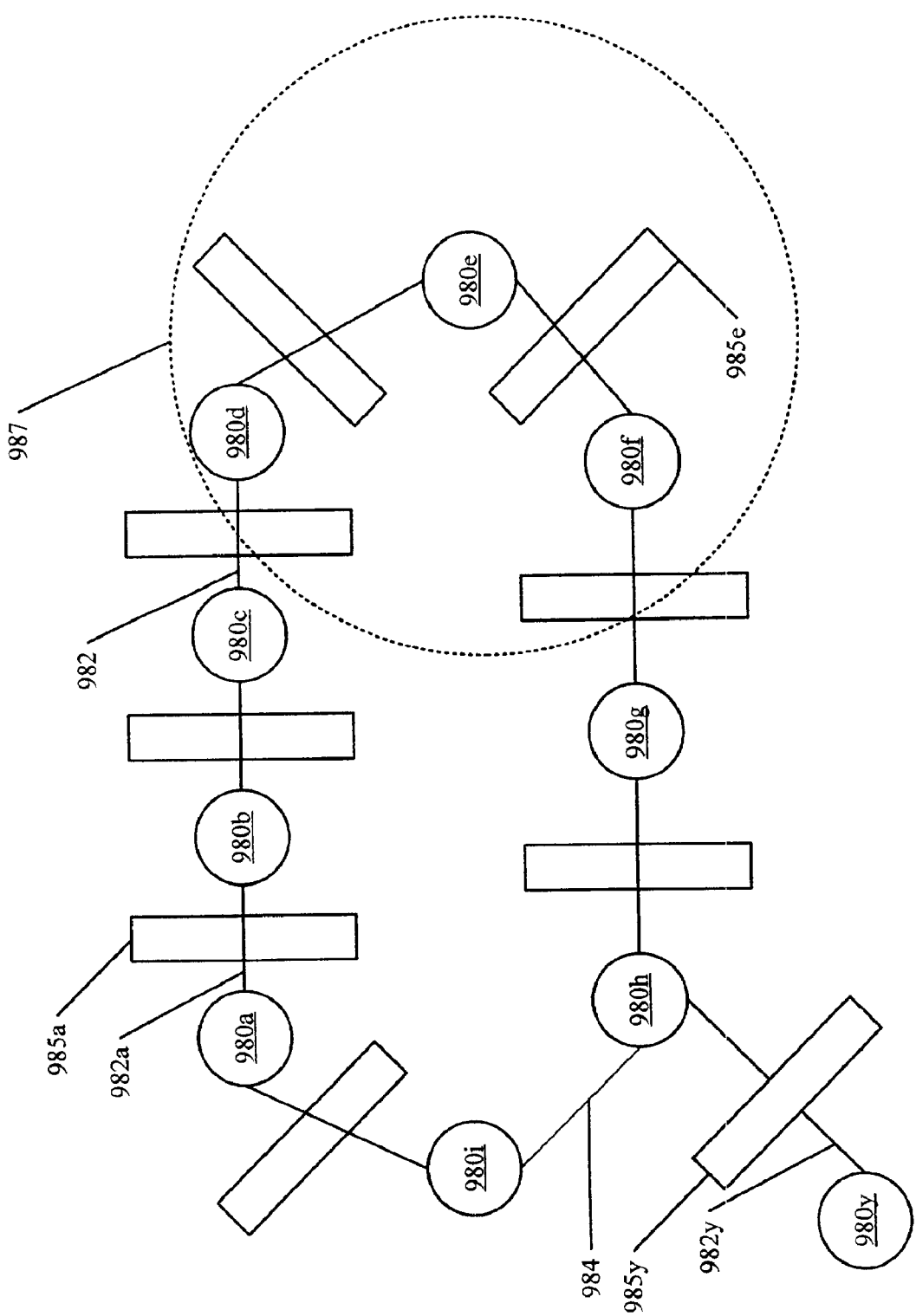
FIG. 9F shows a phase assignment graph associated with the hierarchical unit that resolves the phase conflict according to another embodiment.

FIG. 9F illustrates that movement of an adjusted feature can resolve a phase-shift conflict. In this case, critical feature 985$h$ in FIG. 9D is replaced by critical feature 985$y$ in FIG. 9F. Effectively, critical feature 985$h$ is moved to the position of critical feature 985$y$. It is assumed that critical feature 985$h$ is moved because there is more room in its neighborhood than in the neighborhood of the other features connected by the graphical loop. Alternatively, it is moved because it is easier to accumulate space around it during reverse compaction. To form critical feature 985$y$, a new shifter is placed at node 980$y$, adding a tenth shifter to the graph, and is linked with an opposite phase link 982$y$. Since no critical feature is positioned between the shifters at nodes 980$h$ and 980$i$, these shifters can have the same phase value. If the shifters are far enough apart, no link at all needs to connect them and each is free to assume any value. If this were the case, no link would connect nodes 980$h$ and 980$i$. In either case, the phase-shift conflict on the loop is resolved. Note that the feature adjusted is neither in the same hierarchical subunit nor within the circle 987 centered on the particular feature 985$e$ originally identified as having the unresolved phase-shift conflict.

The conflict sensitive compaction process depicted in FIG. 1 includes any adjustment in layout based on phase-shift conflict information, such as reverse compaction and the selection of alternative viable layouts, whether the adjustment is on the level of the entire design layout or on the level of any hierarchical subunit of it.

In one embodiment, electrical constraints are also checked during the design adjustment process through the use of a layout modification tool. An example of a layout modification tool that checks electrical constraints is the abraCAD™ tool, available from Cadabra Design Systems, a Numerical Technologies™ company. In the described embodiment, the modified phase conflict process 150, and the conflict sensitive compaction process 160, are implemented on a computer system with one or more processors. User input is employed in some embodiments.

Figure 10B:
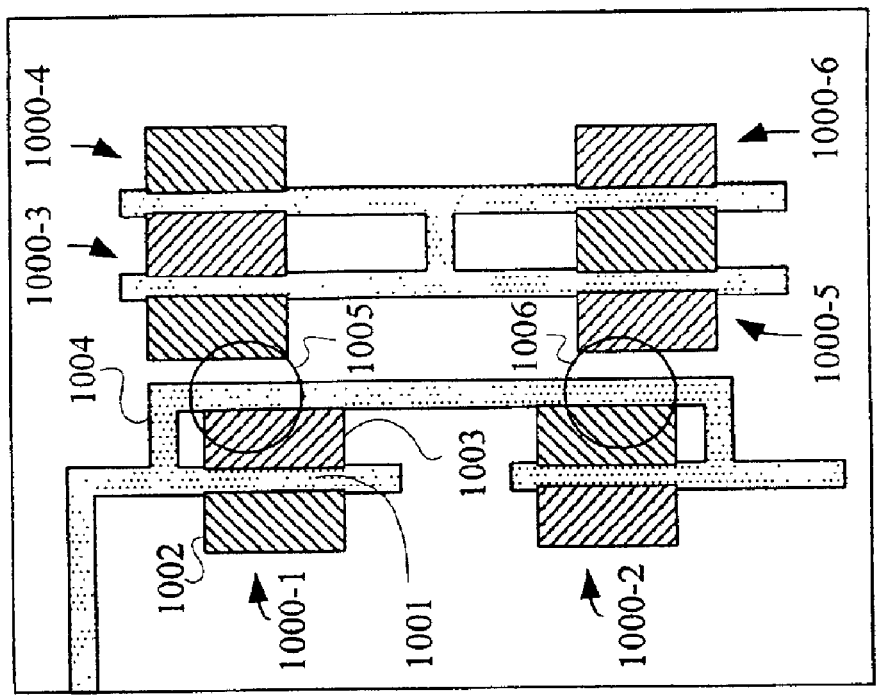
FIG. 10B is the phase-shifted layout of FIG. 10A, wherein phase assignment of this layout results in a functioning circuit.
Figure 10A:
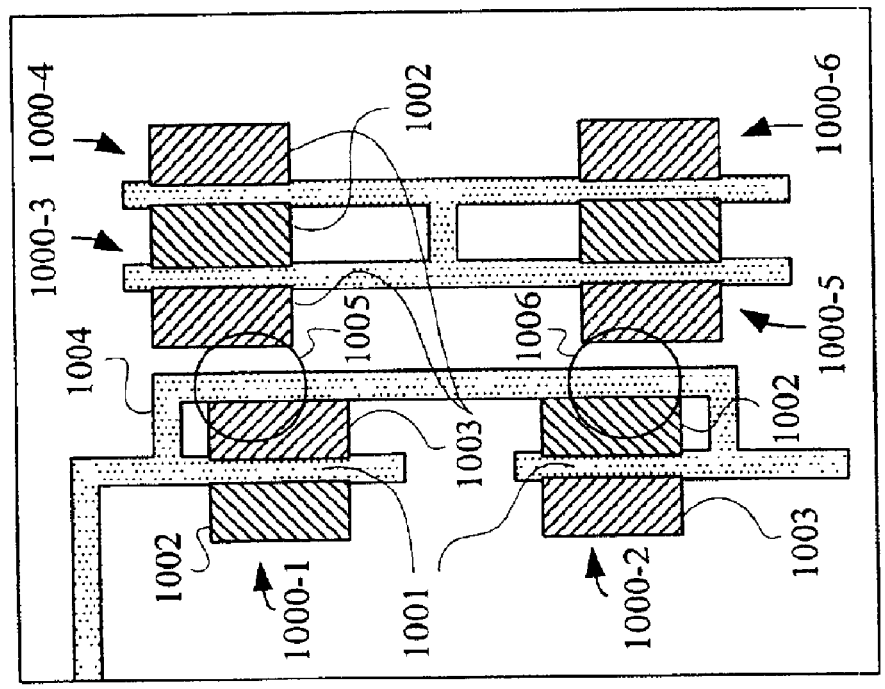
FIG. 10A is a phase-shifted layout including a plurality of transistors, wherein phase assignment of this layout may result in a non-functioning circuit.

Although the assignment of phases to shifters has been discussed above as applying to critical features of the layout, the assignment of phases to shifters also can affect other areas of the layout, such as those areas including non-critical features. Of importance, these non-critical features can also perform significant circuit functions. For example, FIG. 10A illustrates a phase-shifted layout for a conductive layer that can form a plurality of transistors 1000-1 to 1000-6. Each transistor 1000 includes a gate 1001, which is phase-shifted by shifters 1002 and 1003 (of opposite phases, as indicated by the fill pattern) to reduce the area of that gate, thereby improving transistor performance. In FIG. 10A, a wire 1004 connects the gates 1001 of transistors 1000-1 and 1000-2. In an actual circuit, appropriate voltages applied to wire 1004 should turn on/off these transistors. However, because only gates 1001 are considered critical features in this layout, wire 1004 is not defined using phase shifting and will instead be defined using the corresponding trim mask. Nevertheless, for proper circuit functioning, wire 1004 is necessary.

The assignment of relative phases to shifters 1002 and 1003 of transistors 1000 can result in a non-functioning circuit. For example, in FIG. 10A, the phase of shifters 1003 of transistors 1000-1 and 1000-3 in an area 1005 can result in a phase-shift conflict that could adversely affect the printing of wire 1004 within area 1005. Specifically, because wire 1004 is in close proximity to shifters having the same phase, a break in wire 1004 may occur in area 1005 as a result of printing this layout using the assigned phases, thereby causing a malfunction in an actual circuit including transistors 1000-1 and 1000-2.

Note that wire 1004 in an area 1006 is in close proximity to a shifter 1002 of transistor 1000-2 and a shifter 1003 of transistor 1000-5. Because shifters 1002 and 1003 are of opposite phase, wire 1004 can print with no break, thereby eliminating one possible malfunction in the actual circuit including transistors 1000-1 and 1000-2.

To correct the printing problem of wire 1004 in area 1005, relative phase assignment can be applied to shifters relative to both critical and non-critical features in the layout. For example, shifters 1003 of transistors 1000-1 and 1000-3 could be analyzed for phase-shift conflict, even though these shifters are not separated by a critical feature (i.e. a gate 1001). FIG. 10B illustrates a layout in which the relative phase assignments for the shifters of transistors 1000-3 and 1000-4 have been switched, thereby providing shifters of opposite phase in area 1005 and resolving the phase-shift conflict described in FIG. 10A. In this manner, wire 1004 can successfully print in area 1005, thereby increasing yield and performance of the actual circuit including transistors 1000.

In accordance with one feature of relative phase assignment, any two shifters within a predetermined distance of each other are connected by a link having an assigned weight. In one embodiment, any link crossing a critical feature can be considered a "hard" link. In contrast, any link crossing a non-critical feature or no feature can be considered a "soft" link.

Note that analyzing links crossing no features can also significantly improve lithographic performance. Specifically, it has been determined that a phase shifting mask performs optimally with high feature density. Moreover, a trim mask can be used to erase any pseudo feature created by the destructive interference of two shifters of opposite phase (with no layout feature between the shifters). However, in the case of two shifters of the same phase, constructive (not destructive) interference occurs and no pseudo feature is created, but an intervening non-critical feature may be erased or may not print well. Therefore, in a preferred embodiment, any two shifters that can lithographically interfere with one another (i.e. are located within the predetermined distance of each other) can be assigned opposite relative phases to exploit the maximum benefits when exposing the phase shifting mask.

Figure 10C:
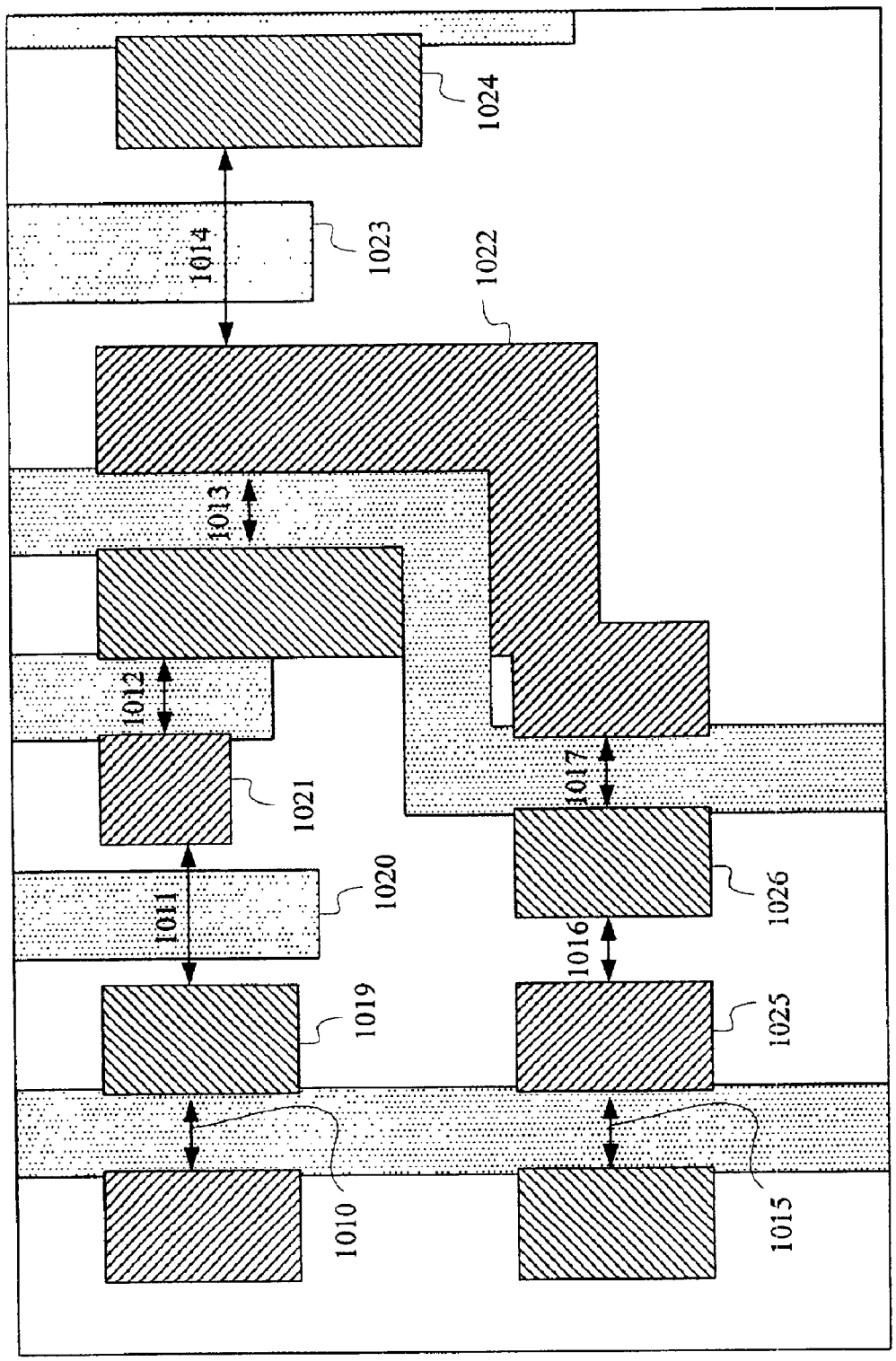
FIG. 10C is an exemplary layout in which links are created between qualified, i.e. interacting, shifters.
Figure 10D:
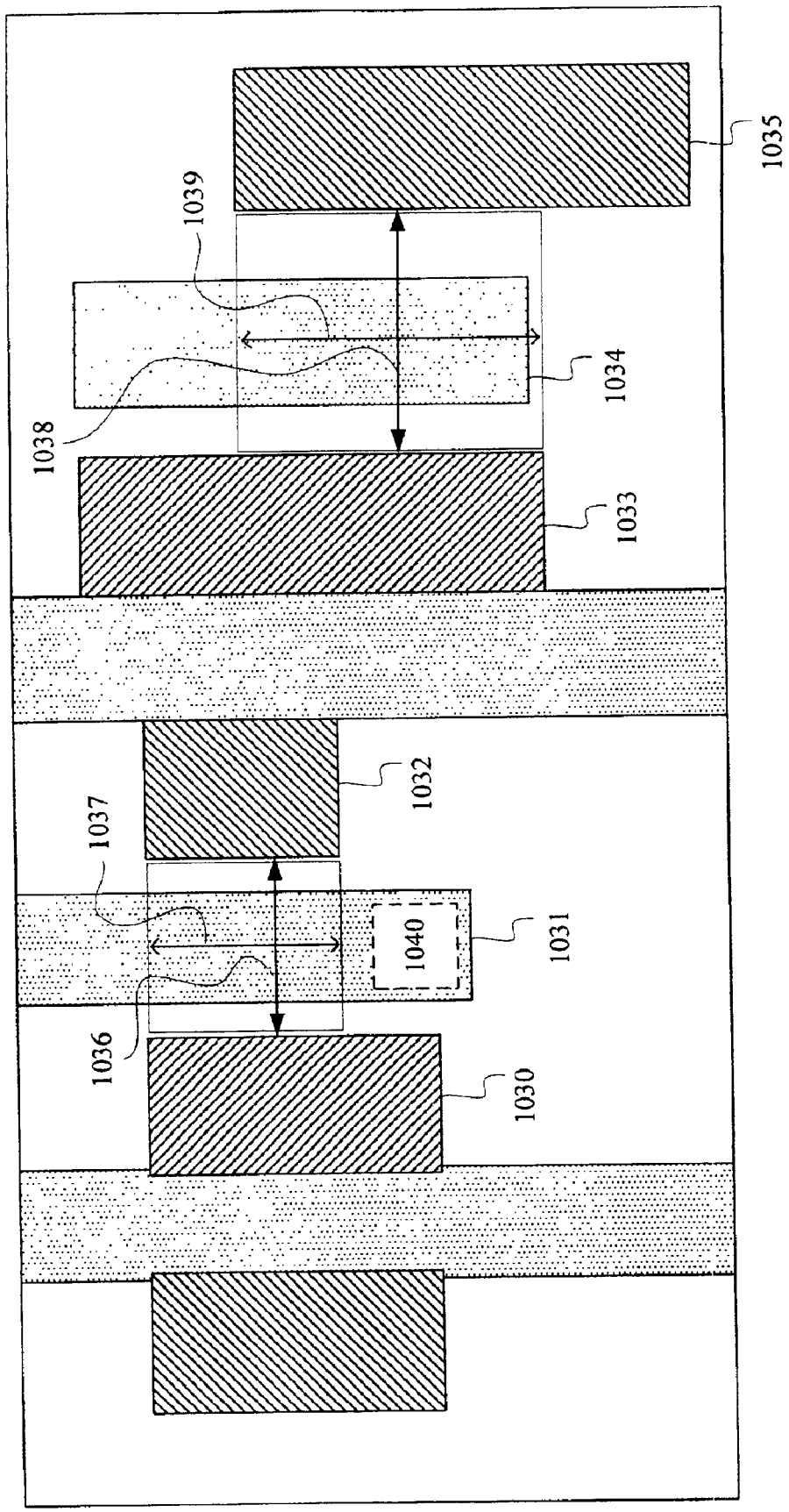
FIG. 10D is a phase-shifted layout wherein two pairs of shifters have measurable orientations, e.g. the lengths over which each pair of shifters are in alignment with one another in the longer direction.

FIG. 10C illustrates an exemplary phase-shifted layout in which links 1010–1017 are created between pairs of shifters. In FIG. 10C, links 1010, 1012, 1013, 1015, and 1017 cross critical features (i.e. gates of transistors) and therefore are hard links. In contrast, links 1011, 1014, and 1016 cross non-critical features or no features and therefore are soft links. Note that a link could be created between shifters 1019 and 1025, for example, if the actual distance between these shifters is equal to or less than the predetermined distance. FIG. 10C assumes that the actual distance is greater than the predetermined distance and therefore a link is not created.

In other embodiments, links are created between all pairs of shifters on the phase layout and then those links having weights less a predetermined amount are removed. In this embodiment, the distance between the shifters is primarily relevant to the weighting, e.g. shifters more than a predetermined distance apart may automatically be assigned a weight of 0.0.

The goal in relative phase assignment is to assign phases to all the shifters without phase-shift conflict. However, in the event that phase-shift conflict does occurs, the breaking of one or more links can be considered to resolve this conflict. In one embodiment, a weight of "1.0" can indicate a hard link, whereas a weight of any value less than "1.0" but greater than or equal to "0.0" can indicate a soft link. The weight of the link generally correlates to the severity of the effect if a phase-shift conflict cannot be resolved, wherein the higher the weight, the more severe the effect on the layout. For example, phase-shift conflict will have more adverse effect on the area of a layout associated with a first link having a weight of "0.7" compared to the area of a layout associated with a second link having a weight of "0.3". Thus, if a phase-shift conflict can be resolved by breaking one of the first and second links, then the second link should be broken. In one embodiment, the adverse effect on a hard link is so severe that the weight of "1.0" indicates that the link cannot normally be broken. In another embodiment, hard links can have a range of values, e.g. between 0.8 and 1.0, wherein in an otherwise non-phase-shiftable layout, at least one of the hard links can be broken based on its weight. For example, in one embodiment, the features defined by hard links may have been identified according to a process such as the one described in PCT Patent Application No. PCT/US01/07413 entitled "Alternating Phase Shift Masking for Multiple Levels of Masking Resolution" filed Mar. 8, 2001, having inventor Shao-Po Wu, and assigned to the assignee of the present invention.

For example, a hard link between a pair of shifters defining a gate may have a first rating (e.g. 1.0) while a hard link between a pair of shifters defining an interconnect may have a second rating (e.g. 0.8). In such an embodiment, if possible the hard link defining the feature with the lower rating will be broken first to resolve the phase conflict. In a variation of this embodiment, the link weighting is permitted to go above 1.0 and the feature rating is encoded in weightings over 1.0. Thus a weight of 1.0 (e.g. interconnect) could be broken before a weight of 10.0 (e.g. gate).

Note that in one embodiment, the hard link can be broken. However, in this embodiment, the user can be notified that a phase-shift error affecting a critical feature has been encountered. The phase assignment program can identify that critical feature and stop processing that region of the layout, but continue phase shifting the remainder of the layout to the extent practical.

As described in reference to FIG. 5, a layout can be divided into cells at different levels in a hierarchy. These cells can include certain features, groups of features, or an arbitrary dividing (uniform or non-uniform) of the layout to facilitate analysis. In accordance with one feature of relative phase assignment, each "qualified" pair of shifters (i.e. shifters within the predetermined distance of each other) can be analyzed whether intra-cell or inter-cell.

Various factors can be used to determine the weight of a soft link. These factors can include, for example, the presence of a non-critical feature between the shifters. Specifically, if a link crosses a non-critical feature, then that link can have a higher weight than a link not crossing any feature. This weighting difference is based on the above-described phenomenon in which shifters of the same phase can adversely affect the printing of the non-critical feature to the point of circuit malfunction (as shown by wire 1004 in area 1005 in FIG. 10A). Thus, for example in FIG. 10C, link 1016 (between shifters 1025 and 1026) could have a lower weight than link 1011 (between shifters 1019 and 1021) because the link 1011 crosses a non-critical feature 1020 whereas link 1016 crosses no feature.

Another factor can include the distance between shifters. Specifically, the greater the distance between the shifters, the lower the weight. Logically, shifters in close proximity can exert greater influence on each other than shifters that are far apart. Thus, for example, link 1011 could have a higher weight than link 1014 because the distance between shifters 1019 and 1021 is less than the distance between shifters 1022 and 1024.

Note that the application of various factors can result in contrary weighting to the links, e.g. returning to links 1011 and 1016. In one embodiment, the factors themselves can be prioritized, wherein one factor can take precedence over another (or multiple) factors. In the case of links 1011 and 1016, the factor including the link crossing a feature could take precedence over the factor including the distance between shifters. In that case, link 1011 would retain a weight higher than link 1016. In another embodiment, the link can be assigned an average weight based on the weights provided by the multiple factors. In yet another embodiment, the multiple factors themselves can be weighted, thereby resulting in a weighted average value being assigned to the link.

Another factor that can be used to determine the weight of a soft link is the minimum distance from a feature to any proximate shifter. Specifically, the distances from the feature to the proximate shifters can be measured (wherein the distances need not be limited to horizontal or vertical directions) and the minimum distance identified. In one embodiment, the greater the minimum distance from the feature to any proximate shifter, the lower the weight of the link crossing that feature. For example, because feature 1020 is closer to shifter 1019 (the closest shifter to feature 1020) than feature 1023 is to shifter 1022 (the closest shifter to feature 1022), link 1011 could have a higher weight than link 1014.

Another factor that can be used to determine the weight of a soft link is at least one dimension associated with one or both of the shifters, e.g. an area, a width, or a height. In one embodiment, the larger the dimension(s), the higher the weight of the link. Generally, a larger shifter has a greater effect on the printing of a feature than a smaller shifter. Thus, assuming a combined area of the two associated shifters is determined, link 1014 could have a higher weight than link 1011 because the combined area of shifters 1022 and 1024 is greater than the combined area of shifters 1019 and 1021.

Another factor that can be used to determine the weight of a soft link is determining the type of feature proximate to the pair of shifters. Specifically, one type of feature can be more critical to circuit operation than another type of feature. For example, wire 1004 (FIG. 10A) that provides a voltage to the gates of transistors in a circuit during standard operation could have a higher weight than feature 1023 (FIG. 10C) that forms part of a test circuit. In one embodiment, the type can refer to features for forming memory, logic, and/or high-speed devices. In yet another embodiment, the type can refer to specific locations on the user's design and/or branches/cells within a hierarchy. The type can be identified from one or more input data files, through a graphical user interface (GUI) on a computer, etc. The identified features could be assigned weights relative to one another. For example, an input data file could identify that the GDS-II cells named A5 should be given higher weightings. Similarly, the GUI could be used to highlight regions of the layout that should be given higher priority, e.g. by selecting within a visual display of the layout on a computer screen.

Another factor that can be used to determine the weight of a soft link is determining critical dimension (CD) variations of a feature using simulation. Specifically, a link crossing a feature that exhibits more significant CD variations can have a higher weight than a link crossing another feature that exhibits less significant CD variations. For example, after identifying link 1011 (between proximate shifters 1019 and 1021) that crosses feature 1020 as well as link 1014 (between proximate shifters 1022 and 1024) that crosses feature 1023, simulations can be performed on both features 1020 and 1023 to determine their respective CD variations. In one embodiment, the simulations can include both opposite and same phase assignments. In this manner, simulations assuming same phase assignments for features 1020 and 1023 can be compared to determine which feature exhibits more CD variations if phase conflict is not resolved. In a similar manner, simulations assuming opposite phase assignments for features 1020 and 1023 can be compared to determine which feature exhibits less CD variation if phase conflict is resolved. Advantageously, assuming that one comparison does not provide a substantial difference, the other comparison might highlight a significant difference, thereby indicating the more appropriate weights for links 1011 and 1014. Thus, for example, if features 1020 and 1023 exhibit substantially the same CD variations assuming opposite phase assignment, but feature 1020 exhibits significantly less CD variation than feature 1023 assuming same phase assignment, then link 1011 crossing feature 1020 can have a higher weight than link 1014 crossing feature 1023. In another embodiment, weights assigned for the two simulations for one feature can be averaged or weighted to emphasize CD variations resulting from one phase assignment simulation.

Another factor that can be used to determine the weight of a soft link is the size of any feature proximate to the pair of shifters. For example, if wire 1004 (FIG. 10A) were wide enough, then wire 1004 could successfully print in area 1005 even in the presence of two shifters of the same phase, then a lower weight could be assigned. Thus, the larger the size of the feature, the lower the weight of the link crossing that feature.

Yet another factor that can be used to determine the weight of a soft link is the orientation of the shifters to each other. In one embodiment, the orientation can refer to a length over which two proximate shifters are in alignment with one another in the longer direction. For example in FIG. 10D, link 1036 could have a lower weight than link 1038 because the length over which shifters 1030 and 1032 are in alignment with one another in the longer direction (as measured by line 1037) is less than the length over which shifters 1033 and 1035 are in alignment with one another in the longer direction (as measured by line 1039). Note that another factor, such as the distances of features 1031/1034 to their associated shifters, could take priority over this orientation factor.

Finally, another factor that can be used to determine the weight of a soft link is multi-layer interaction. For example, if a contact 1040 were to connect to feature 1031, as determined from information from a contact layout, then feature 1031 could be given a higher weight than feature 1034, which will not connect to a contact.

In one embodiment, the user can set the range of weights that can be assigned to the links as well as the priorities of various factors. In another embodiment, a phase-assigning tool, such as the iN-Phase™ software licensed by Numerical Technologies, Inc., can assign default weights and designate priorities. In one such default system, the weight of the link could be equal to $(1/d)+\epsilon$, wherein d can be the distance between shifters and $\epsilon$ can be a function of the factor with priority.

Figure 10E:
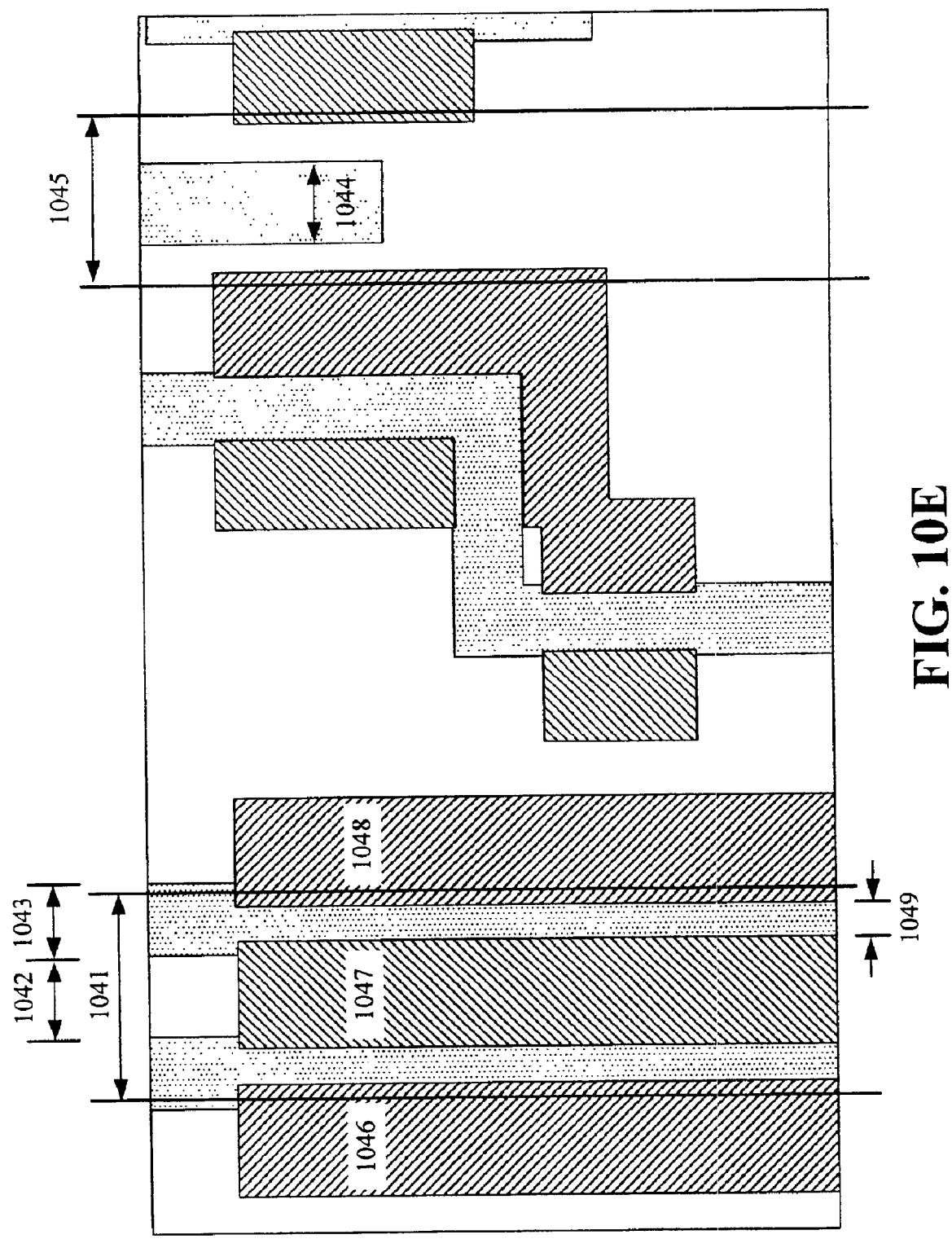
FIG. 10E is a layout in which a minimum feature width and a minimum pitch are identified.

In one embodiment, determining the predetermined distance to identify qualified shifter pairs can include identifying the minimum feature width on the layout, the minimum pitch, and the regulator width. For example, referring to FIG. 10E, the predetermined distance should preferably be slightly larger than a minimum feature width 1044. (Note that a predetermined distance smaller than a minimum feature width would result in very few links.) Thus, based on minimum feature width 1044, a predetermined distance 1045 could be used. FIG. 10E also illustrates an exemplary pitch, which typically includes a width 1043 of a line and a minimum spacing 1042 needed to separate one line from another line. The regulator width 1049 is defined as the actual distance between two shifters. In one embodiment, the predetermined distance should be no greater than the combined pitch (1042+1043) and regulator width 1049. In this manner, each shifter provided in an area of closely spaced lines would have only one link, not multiple links. For example, in FIG. 10E, if a predetermined distance 1041 were greater than the combined pitch and regulator width, then shifter 1046 would have two links (i.e. one link to shifter 1047 and another link to shifter 1048). Logically, to analyze relative phase assignment with respect to shifter 1046, shifter 1047 is significantly more relevant than shifter 1048. Therefore, using the combined pitch and regulator width as the maximum predetermined distance addresses the more important lithographic influence and minimizes redundancy in phase assignment. In one embodiment, either the sized-up minimum feature size, or the combined pitch and regulator width can be used for the predetermined distance. In another embodiment, an average of the sized-up minimum feature size and the combined pitch and regulator width can be used for the predetermined distance.

Figure 10F:
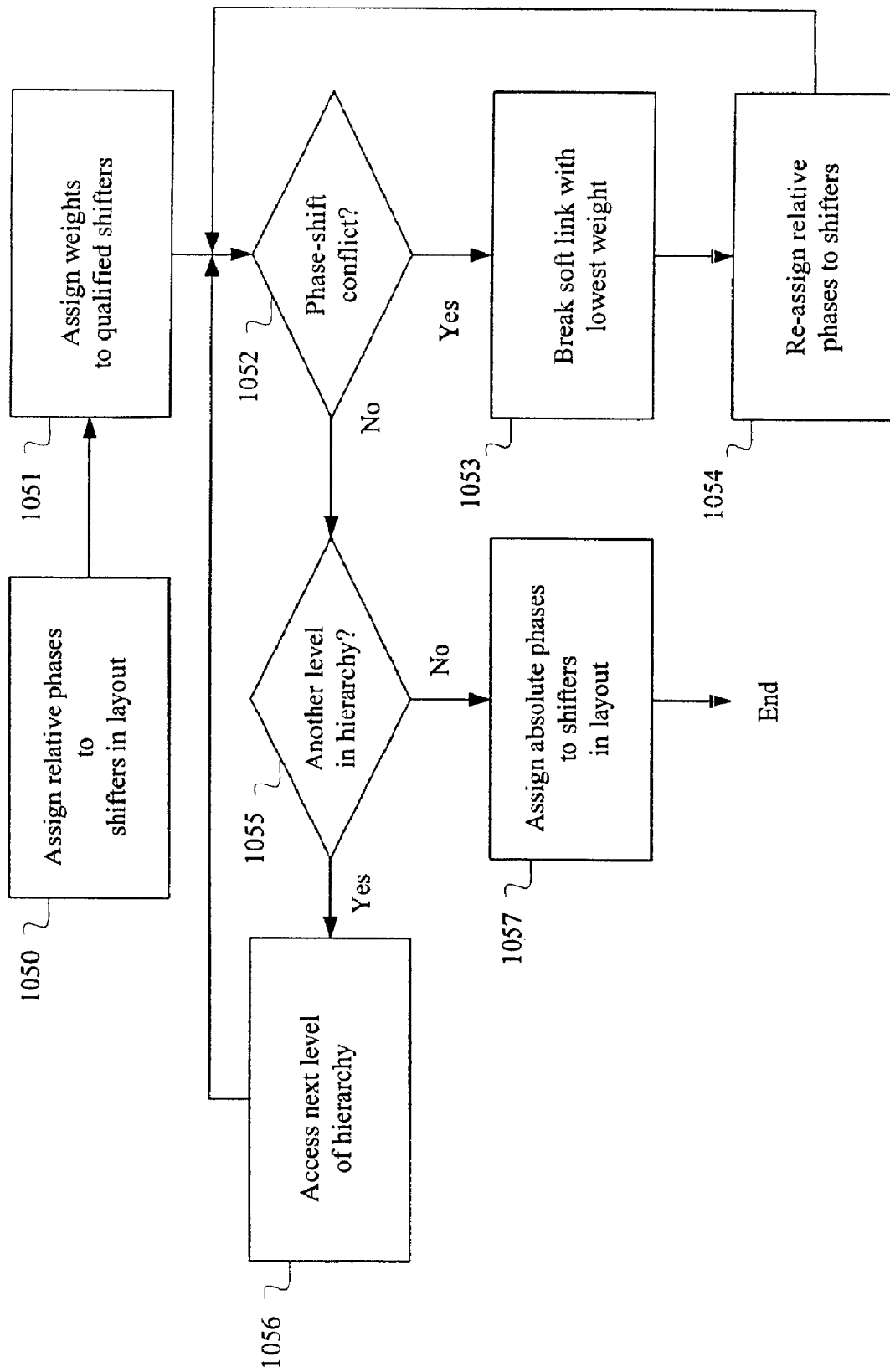
FIG. 10F is a flow chart that illustrates the steps in assigning relative phases using links with weights.

FIG. 10F illustrates a flow chart of assigning relative phases using links with weights. In step 1050, relative phases can be assigned to all shifters. In step 1051, weights can be assigned to qualified shifters using one or more factors. If phase shift conflict exists in the layout, as determined in step 1052, then the soft link with the lowest weight can be broken in step 1053. In step 1054, relative phases can be re-assigned to minimize phase-shift conflict and the process can return to step 1052. If phase-shift conflict is resolved (step 1052), and another level of hierarchy exists, as determined in step 1055, then the next level in the unit hierarchy can be accessed in step 1056 and the process returns to step 1052 to determine if phase-shift conflict exists at the next level of hierarchy. If there is no other level in the hierarchy (step 1055), then absolute phases can be assigned to the shifters in the layout in step 1057.

Note that other lithographic solutions, including OPC and/or other resolution enhancement techniques (RETs), can be used to ensure that features adversely affected by the broken soft links will print in an acceptable manner. Advantageously, because relative phase assignment with weighted links corrects many phase conflicts, the need for and complexity associated with these other lithographic solutions are both significantly reduced.

In one embodiment, relative phase assignment can be performed without the need to continually access layout information. Specifically, after the shifters are identified and defined, a coloring engine can construct a coloring graph, e.g. a network of shifters that can be colored to represent predetermined phases, to facilitate relative phase assignment. In accordance with one feature of the invention, this coloring graph can include links between all qualified shifters (in contrast to assigning phases to shifters associated only with critical features). The selective breaking of soft links can be done by considering the various factors described above in detail. Note that the coloring engine can analyze some factors, such as the width of a shifter and the offset of the shifters, with only shifter information. Other factors, such as the distance of a shifter to a feature and the type of feature crossed by the link, logically include both shifter and feature information. In either case, the necessary information for relative phase assignment can be provided to the coloring engine for analysis. Once this information is received, the coloring engine need not have further access to the layout. Thus, the coloring engine can advantageously operate independently from other engines, which might need access to the layout, thereby improving system efficiency and performance. Furthermore, the weights incorporate all information regarding the links in one embodiment.

Hardware Overview

Figure 11:
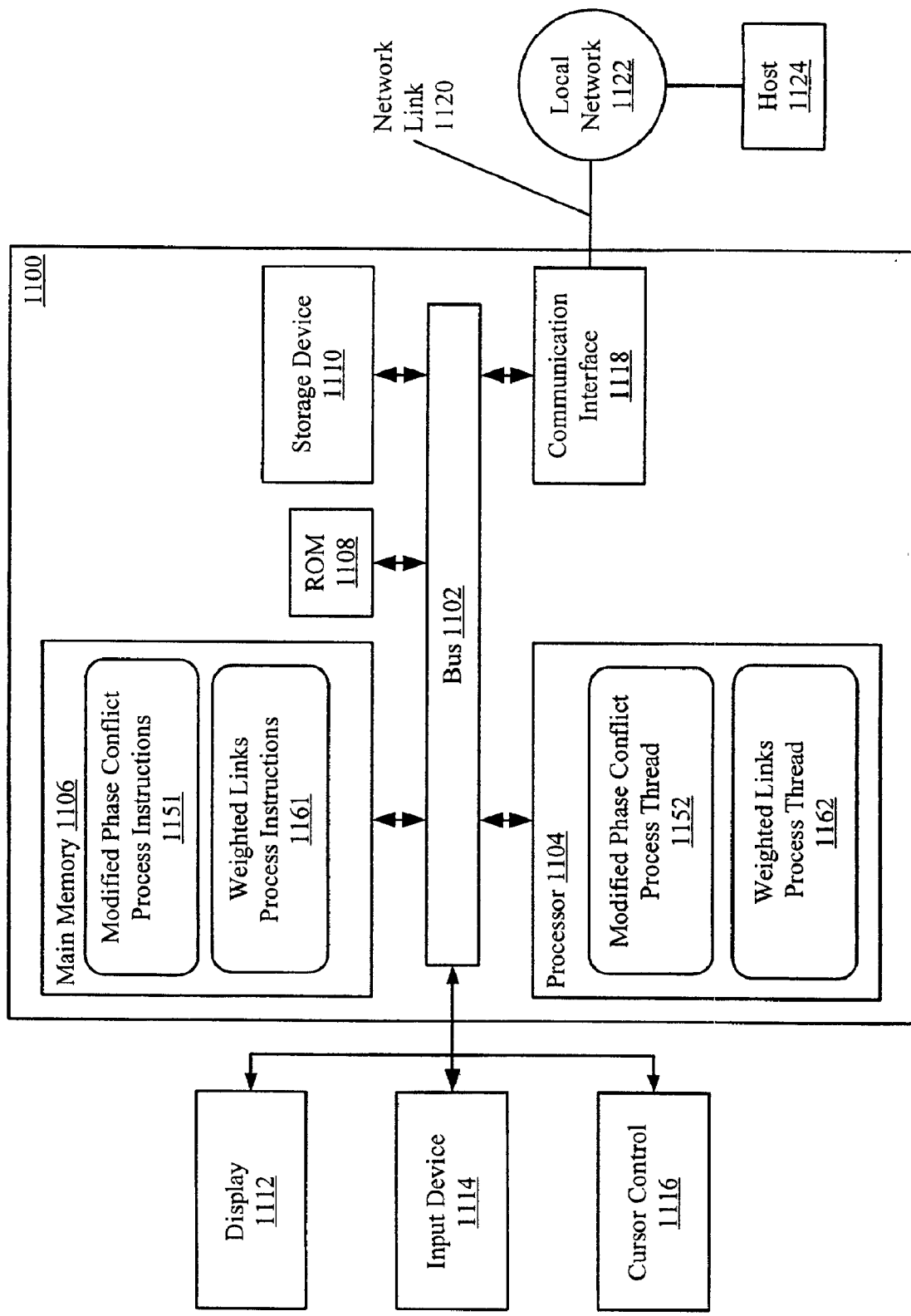
FIG. 11 is a block diagram of a computer system according to one embodiment.

FIG. 11 is a block diagram that illustrates a computer system 1100 upon which an embodiment of the invention is implemented. Computer system 1100 includes a bus 1102 or other communication mechanism for communicating information, and a processor 1104 of one or more processors coupled with bus 1102 for processing information. Computer system 1100 also includes a main memory 1106, such as a random access memory (RAM) or other dynamic storage device, coupled to bus 1102 for storing information and instructions to be executed by processor 1104. Main memory 1106 also may be used for storing temporary variables or other intermediate information during execution of instructions to be executed by processor 1104. Computer system 1100 further includes a read only memory (ROM) 1108 or other static storage device coupled to bus 1102 for storing static information and instructions for processor 1104. A storage device 1110, such as a magnetic disk or optical disk, is provided and coupled to bus 1102 for storing information and instructions.

Computer system 1100 may be coupled via bus 1102 to a display 1112, such as a cathode ray tube (CRT), for displaying information to a computer user. An input device 1114, including alphanumeric and other keys, is coupled to bus 1102 for communicating information and command selections to processor 1104. Another type of user input device is cursor control 1116, such as a mouse, a trackball, or cursor direction keys for communicating direction information and command selections to processor 1104 and for controlling cursor movement on display 1112. This input device typically has two degrees of freedom in two axes, a first axis (e.g., x) and a second axis (e.g., y), that allows the device to specify positions in a plane.

The invention is related to the use of computer system 1100 for producing design layouts and fabrication layouts According to one embodiment of the invention, layouts are provided by computer system 1100 based on processor 1104 executing one or more sequences of one or more instructions contained in main memory 1106. For example, the modified phase conflict and weighted links processes can run as threads 1152 and 1162 on processor 1104 based on modified phase conflict process instructions 1151 and weighted links process instructions 1161 stored in main memory 1106. Such instructions may be read into main memory 1106 from another computer-readable medium, such as storage device 1110. Execution of the sequences of instructions contained in main memory 1106 causes processor 1104 to perform the process steps described herein. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 1104 for execution. Such a medium may take many forms, including but not limited to, non-volatile media, volatile media, and transmission media. Non-volatile media includes, for example, optical or magnetic disks, such as storage device 1110. Volatile media includes dynamic memory, such as main memory 1106. Transmission media includes coaxial cables, copper wire and fiber optics, including the wires that comprise bus 1102. Transmission media can also take the form of acoustic or light waves, such as those generated during radio-wave and infra-red data communications.

Common forms of computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1104 for execution. For example, the instructions may initially be carried on a magnetic disk of a remote computer. The remote computer can load the instructions into its dynamic memory and send the instructions over a telephone line using a modem. A modem local to computer system 1100 can receive the data on the telephone line and use an infrared transmitter to convert the data to an infra-red signal. An infra-red detector can receive the data carried in the infra-red signal and appropriate circuitry can place the data on bus 1102. Bus 1102 carries the data to main memory 1106, from which processor 1104 retrieves and executes the instructions. The instructions received by main memory 1106 may optionally be stored on storage device 1110 either before or after execution by processor 1104.

Computer system 1100 also includes a communication interface 1118 coupled to bus 1102. Communication interface 1118 provides a two-way data communication coupling to a network link 1120 that is connected to a local network 1122. For example, communication interface 1118 may be an integrated services digital network (ISDN) card or a modem to provide a data communication connection to a corresponding type of telephone line. As another example, communication interface 1118 may be a local area network (LAN) card to provide a data communication connection to a compatible LAN. Wireless links may also be implemented. In any such implementation, communication interface 1118 sends and receives electrical, electromagnetic or optical signals that carry digital data streams representing various types of information.

Network link 1120 typically provides data communication through one or more networks to other data devices. For example, network link 1120 may provide a connection through local network 1122 to a host computer 1124. Local network 1122 uses electrical, electromagnetic or optical signals that carry digital data streams. The signals through the various networks and the signals on network link 1120 and through communication interface 1118, which carry the digital data to and from computer system 1100, are exemplary forms of carrier waves transporting the information.

Computer system 1100 can send messages and receive data, including program code, through the network(s), network link 1120 and communication interface 1118.

The received code may be executed by processor 1104 as it is received, and/or stored in storage device 1110, or other non-volatile storage for later execution. In this manner, computer system 1100 may obtain application code in the form of a carrier wave.

In the foregoing specification, the invention has been described with reference to specific embodiments thereof. It will, however, be evident that various modifications and changes may be made thereto without departing from the broader spirit and scope of the invention. Finally, the system and methods described herein can be applied to any lithographic process technologies, including ultraviolet, deep ultraviolet (DUV), extreme ultraviolet (EUV), x-ray, and e-beam. The specification and drawings are, accordingly, to be regarded in an illustrative rather than a restrictive sense.

What is claimed is:

1. A method of assigning phases to shifters on a layout, the method comprising:
    creating a link between any two shifters within a predetermined distance from each other, wherein a link corresponds to an indication that linked shifters are preferably assigned different phases;
    assigning a weight to at least one link;
    assigning phases to the shifters;
    identifying whether a phase-shift conflict exists on the layout;
    breaking a link based on its weight if a phase-shift conflict exists; and
    reassigning phases to the shifters.

2. A method of assigning phases to shifters on a layout, the method comprising:
    creating a link between any two shifters within a predetermined distance from each other, wherein a link corresponds to an indication that linked shifters are preferably assigned different phases;
    assigning a weight to at least one link;
    assigning phases to the shifters;
    identifying whether a phase-shift conflict exists on the layout;
    breaking a link based on its weight if a phase-shift conflict exists; and
    breaking a plurality of links until the phase conflict is resolved.

3. The method of claim 2, wherein the plurality of broken links have a different range of weights than any remaining links between shifters.

4. A method of assigning phases to shifters on a layout, the method comprising:
    creating a link between any two shifters within a predetermined distance from each other, wherein a link corresponds to an indication that linked shifters are preferably assigned different phases;
    assigning a weight to at least one link, wherein assigning a weight includes determining at least one dimension associated with each of the linked shifters;
    assigning phases to the shifters;
    identifying whether a phase-shift conflict exists on the layout; and
    breaking a link based on its weight if a phase-shift conflict exists.

5. The method of claim 4, wherein the at least one dimension includes an area.

6. A method of assigning phases to shifters on a layout, the method comprising:
    creating a link between any two shifters within a predetermined distance from each other, wherein a link corresponds to an indication that linked shifters are preferably assigned different phases;
    assigning a weight to at least one link, wherein assigning a weight includes determining an orientation of the linked shifters;
    assigning phases to the shifters;
    identifying whether a phase-shift conflict exists on the layout; and
    breaking a link based on its weight if a phase-shift conflict exists.

7. The method of claim 6, wherein the orientation includes a length over which the linked shifters are aligned.

8. A method of assigning phases to shifters on a layout, the method comprising:
    creating a link between any two shifters within a predetermined distance from each other, wherein a link corresponds to an indication that linked shifters are preferably assigned different phases;
    assigning a weight to at least one link, wherein assigning a weight includes determining whether a critical feature of the layout is located between the linked shifters;
    assigning phases to the shifters;
    identifying whether a phase-shift conflict exists on the layout; and
    breaking a link based on its weight if a phase-shift conflict exists.

9. A method of assigning phases to shifters on a layout, the method comprising:
    creating a link between any two shifters within a predetermined distance from each other, wherein a link corresponds to an indication that linked shifters are preferably assigned different phases;
    assigning a weight to at least one link, wherein assigning a weight includes determining whether a non-critical feature of the layout is located between the linked shifters;
    assigning phases to the shifters;
    identifying whether a phase-shift conflict exists on the layout; and
    breaking a link based on its weight if a phase-shift conflict exists.

10. A method of assigning phases to shifters on a layout, the method comprising:
    creating a link between any two shifters within a predetermined distance from each other, wherein a link corresponds to an indication that linked shifters are preferably assigned different phases;
    assigning a weight to at least one link, wherein assigning a weight includes determining whether a feature of the layout is located between the linked shifters;
    assigning phases to the shifters;
    identifying whether a phase-shift conflict exists on the layout; and
    breaking a link based on its weight if a phase-shift conflict exists.

11. The method of claim 10, wherein assigning a weight further includes determining a minimum distance from the feature to any proximate shifter.

12. The method of claim 10, wherein assigning a weight includes identifying the feature by its type.

13. The method of claim 10, wherein assigning a weight includes determining a size of the feature.

14. The method of claim 10, wherein assigning a weight includes determining an association between the feature and another feature on another layout.

15. The method of claim 10, wherein assigning a weight includes performing a simulation on the feature to determine critical dimension (CD) variations.

16. The method of claim 15, wherein performing a simulation includes a first simulation assuming same phase assignment and a second simulation assuming opposite phase assignment.

17. A method of assigning phases to shifters on a layout, the method comprising:
   creating a link between any two shifters within a predetermined distance from each other, wherein the predetermined distance is larger than a minimum feature size on the layout, wherein a link corresponds to an indication that linked shifters are preferably assigned different phases;
   assigning a weight to at least one link;
   assigning phases to the linked shifters;
   identifying whether a phase-shift conflict exists on the layout; and
   breaking a link based on its weight if a phase-shift conflict exists.

18. A method of assigning phases to shifters on a layout, the method comprising:
   creating a link between any two shifters within a predetermined distance from each other, wherein the predetermined distance is smaller than a combined minimum pitch and regulator width on the layout, wherein a link corresponds to an indication that linked shifters are preferably assigned different phases;
   assigning a weight to at least one link;
   assigning phases to the shifters;
   identifying whether a phase-shift conflict exists on the layout; and
   breaking a link based on its weight if a phase-shift conflict exists.

19. A method of assigning phases to shifters on a layout, the method comprising:
   creating a link between any two shifters within a predetermined distance from each other, wherein a link corresponds to an indication that linked shifters are preferably assigned different phases;
   assigning a weight to at least one link;
   assigning phases to the shifters;
   identifying whether a phase-shift conflict exists on the layout; and
   breaking a link based on its weight if a phase-shift conflict exists, wherein assigning phases occurs after identifying and breaking.

20. A method of assigning phases to shifters on a layout, the method comprising:
   identifying a plurality of critical features on the layout, wherein each critical feature has a pair of associated shifters;
   identifying any non-critical feature on the layout, wherein the non-critical feature is without a pair of associated shifters, but is located between two proximate shifters, and wherein the two proximate shifters are located within a predetermined distance of each other;
   assigning phases to the pairs of associated shifters; and
   minimizing phase-shift conflict between any of the two proximate shifters.

21. The method of claim 20, further including:
   creating a hard link between the pair of associated shifters, wherein a hard link indicates that the associated shifters have opposite phase; and
   creating a soft link between the two proximate shifters, wherein a soft link indicates that the proximate shifters preferably have opposite phase.

22. The method of claim 21, wherein creating a soft link includes providing a weight for each soft link.

23. The method of claim 22, wherein minimizing phase-shift conflict includes breaking the soft link having one of a lowest weight and a highest weight.

24. A computer program product comprising:
   a computer usable medium having a computer readable program code embodied therein for causing a computer to analyze a layout including a plurality of shifters and to resolve any phase-shift conflict on the layout, the computer readable program code comprising:
   computer readable program code that creates a link between any two shifters within a predetermined distance from each other;
   computer readable program code that assigns a weight to each link;
   computer readable program code that assigns phases to linked shifters;
   computer readable program code that identifies whether a phase-shift conflict exists on the layout; and
   computer readable program code that breaks a link based on its weight, if a phase-shift conflict exists,
   wherein the computer readable program code that assigns a weight to each link further includes:
   computer readable program code that determines at least one of:
   a distance between the linked shifters;
   at least one dimension associated with each of the linked shifters;
   an orientation of the linked shifters; and
   whether a feature is located between the linked shifters.

25. A computer program product comprising:
   a computer usable medium having a computer readable program code embodied therein for causing a computer to analyze a layout including a plurality of shifters and to resolve any phase-shift conflict on the layout, the computer readable program code comprising:
   computer readable program code that creates a link between any two shifters within a predetermined distance from each other;
   computer readable program code that assigns a weight to each link;
   computer readable program code that assigns phases to linked shifters;
   computer readable program code that identifies whether a phase-shift conflict exists on the layout; and
   computer readable program code that breaks a link based on its weight, if a phase-shift conflict exists,
   wherein the computer readable program code that determines whether a feature is located between the linked shifters further includes:
   computer readable program code that determines a minimum distance from the feature to any proximate shifter.

26. A computer program product comprising:
a computer usable medium having a computer readable program code embodied therein for causing a computer to analyze a layout including a plurality of shifters and to resolve any phase-shift conflict on the layout, the computer readable program code comprising:
computer readable program code that creates a link between any two shifters within a predetermined distance from each other;
computer readable program code that assigns a weight to each link;
computer readable program code that assigns phases to linked shifters;
computer readable program code that identifies whether a phase-shift conflict exists on the layout; and
computer readable program code that breaks a link based on its weight, if a phase-shift conflict exists,
wherein the computer readable program code that determines whether a feature is located between the linked shifters further includes:
computer readable program code that identifies the feature by one of its type and its size.

27. A program storage device readable by a machine, tangibly embodying a program of instructions executable by said machine to perform method steps to analyze a mask used in lithography, the method comprising:
creating a link between any two shifters within a predetermined distance from each other;
assigning a weight to each link;
assigning phases to linked shifters;
identifying whether a phase-shift conflict exists on the layout;
breaking a link based on its weight, if a phase-shift conflict exists; and
reassigning phases to the linked shifters.

28. A program storage device readable by a machine, tangibly embodying a program of instructions executable by said machine to perform method steps to analyze a mask used in lithography, the method comprising:
creating a link between any two shifters within a predetermined distance from each other;
assigning a weight to each link;
assigning phases to linked shifters;
identifying whether a phase-shift conflict exists on the layout;
breaking a link based on its weight, if a phase-shift conflict exists; and
breaking a plurality of links until the phase conflict is resolved.

29. A program storage device readable by a machine, tangibly embodying a program of instructions executable by said machine to perform method steps to analyze a mask used in lithography, the method comprising:
creating a link between any two shifters within a predetermined distance from each other;
assigning a weight to each link;
assigning phases to linked shifters;
identifying whether a phase-shift conflict exists on the layout; and
breaking a link based on its weight, if a phase-shift conflict exists, wherein any broken links have a different range of weights than any remaining links between shifters.

* * * * *